United States Patent
Asami

(10) Patent No.: US 8,519,872 B2
(45) Date of Patent: Aug. 27, 2013

(54) ANALOG-DIGITAL CONVERTING METHOD AND ANALOG-DIGITAL CONVERTING APPARATUS

(75) Inventor: Koji Asami, Saitama (JP)

(73) Assignee: Advantest Corporation, Tokyo (JP)

( * ) Notice: Subject to any disclaimer, the term of this patent is extended or adjusted under 35 U.S.C. 154(b) by 340 days.

(21) Appl. No.: 13/157,272

(22) Filed: Jun. 9, 2011

(65) Prior Publication Data

US 2012/0176260 A1  Jul. 12, 2012

Related U.S. Application Data

(63) Continuation of application No. PCT/JP2009/006677, filed on Dec. 7, 2009.

(30) Foreign Application Priority Data

Jan. 19, 2009  (JP) .................................. 2009-009247

(51) Int. Cl.
  *H03M 1/06*  (2006.01)
(52) U.S. Cl.
  USPC .......................................... 341/118; 341/155
(58) Field of Classification Search
  USPC ................................. 341/118, 155
  See application file for complete search history.

(56) References Cited

U.S. PATENT DOCUMENTS 6,384,756 B1 *  5/2002  Tajiri et al. .................... 341/120
2008/0272942 A1 *  11/2008  Asami .......................... 341/118

FOREIGN PATENT DOCUMENTS

JP  2000-346913 A  12/2000
WO  2006/126672 A1  11/2006

OTHER PUBLICATIONS

Notice of Reasons for Rejection issued by the Japanese Patent Office for application No. 2010-546463.

\* cited by examiner

*Primary Examiner* — Khai M Nguyen

(57) ABSTRACT

An analog-digital converting method comprising measuring, in advance, frequency characteristics of each of a plurality of ADCs; intra-group correction of, for each of a plurality of groups obtained by dividing a plurality of measurement signals, generating measurement signals that would be obtained when the frequency characteristics of the corresponding ADCs are ideal by multiplying the measurement signals by a correction coefficient that is based on the frequency characteristics of all the ADCs in the group; and inter-group correction of correcting and combining the frequency characteristics of the groups based on a difference in the frequency characteristics between the groups formed during the intra-group correction, to generate a frequency spectrum of the digital signal.

22 Claims, 16 Drawing Sheets

ANALOG-DIGITAL CONVERTING METHOD AND ANALOG-DIGITAL CONVERTING APPARATUS

BACKGROUND

1. TECHNICAL FIELD

The present invention relates to an analog-digital converting method and an analog-digital converting apparatus for converting an analog signal into a digital signal.

2. RELATED ART

An N-way interleaved analog-digital converting method is known that involves using N analog-digital converters (referred to hereinafter as "ADCs"), when converting an analog signal into a digital signal, in order to increase the apparent sampling rate, as shown in Japanese Patent Application Publication No. 2000-346913, for example.

With this interleaved analog-digital converting method, however, the frequency spectrum of the digital signal cannot be accurately calculated if there is an error in the phase of the sampling clock provided to each ADC or in the frequency characteristics of the ADCs.

For example, the phase of the sampling clock provided to each ADC must be different for each ADC by a prescribed amount, and it is difficult to accurately shift the phase of the sampling clock by units of the prescribed amount. Furthermore, even when the sampling clock is provided to each ADC with the correct phase, variation in the gain or the sampling timing of the ADCs occurs if the frequency characteristics of the ADCs are not ideal, and this makes it difficult to accurately calculate the frequency spectrum of the digital signal.

SUMMARY

Therefore, it is an object of an aspect of the innovations herein to provide an analog-digital converting method and an analog-digital converting apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is an analog-digital converting method for converting an analog signal into a digital signal using a plurality of analog-digital converters provided with a sampling clock whose phase is shifted by a prescribed period for each analog-digital converter. The analog-digital converting method comprises measurement of measuring, in advance, frequency characteristics of each of the analog-digital converters; sampling of sampling the analog signal using the analog-digital converters; intra-group correction of, for each of a plurality of groups obtained by dividing a plurality of measurement signals generated using the analog-digital converters, generating measurement signals that would be obtained when the frequency characteristics of the corresponding analog-digital converters are ideal by multiplying the measurement signals by a correction coefficient that is based on the frequency characteristics of all the analog-digital converters in the group; and inter-group correction of correcting and combining the frequency characteristics of the groups based on a difference in the frequency characteristics between the groups formed during the intra-group correction, to generate a frequency spectrum of the digital signal.

According to a second aspect related to the innovations herein, provided is an analog-digital converting apparatus that converts an analog signal into a digital signal, comprising a plurality of analog-digital converters provided with a sampling clock whose phase is shifted by a prescribed period for each analog-digital converter; a measuring section that measures, in advance, frequency characteristics of each of the analog-digital converters; Fourier transform sections that perform a Fourier transform on each piece of data obtained by the analog-digital converters sampling the analog signal; an intra-group correcting section that, for each of a plurality of groups obtained by dividing a plurality of measurement signals, generates ideal measurement signals that would be obtained when the frequency characteristics of the corresponding analog-digital converters are ideal by multiplying the measurement signals by a correction coefficient that is based on the frequency characteristics of all the analog-digital converters in the group; an inter-group correcting section that corrects the frequency characteristics of the groups based on a difference in the frequency characteristics between the groups formed by the intra-group correcting section; and an interleaving section that combines the ideal measurement signals to generate a frequency spectrum of the digital signal.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
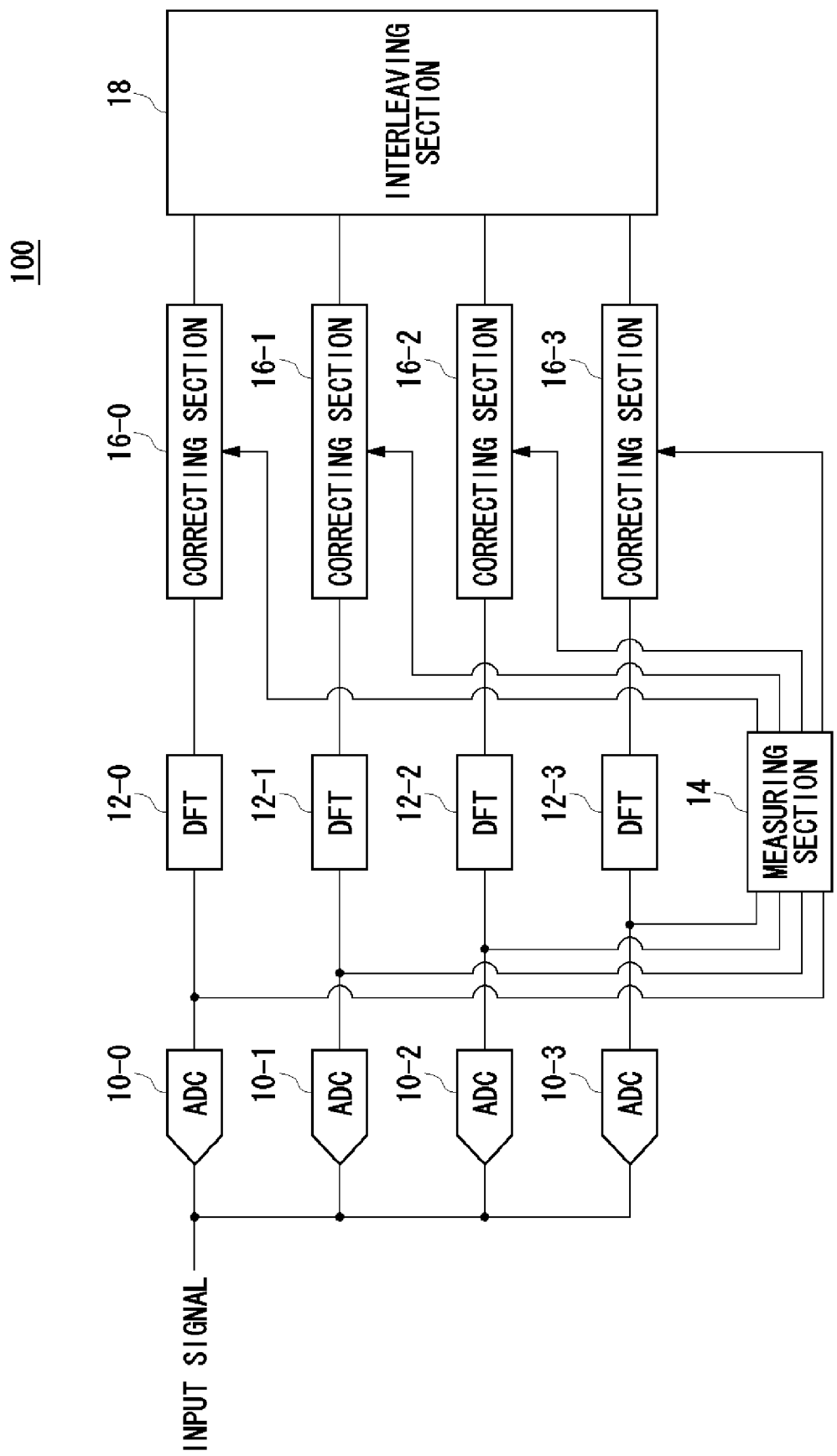
FIG. 1 shows an exemplary configuration of an interleaved AD converting apparatus 100 according to an embodiment of the present invention.

FIG. 1 shows an exemplary configuration of an interleaved AD converting apparatus 100 according to an embodiment of the present invention. The interleaved AD converting apparatus 100 converts an analog signal, which is supplied thereto as an input signal, into a digital signal. The interleaved AD converting apparatus 100 includes a plurality of ADCs 10-0 to 10-3 (referred to hereinafter collectively as the "ADCs 10"), a plurality of Fourier transform sections 12-0 to 12-3 (referred to hereinafter collectively as the "Fourier transform sections 12"), a plurality of correcting sections 16-0 to 16-3 (referred to hereinafter collectively as the "correcting sections 16"), a measuring section 14, and an interleaving section 18. The interleaved AD converting apparatus 100 of the present embodiment uses four ADCs 10 to convert an analog signal into a digital signal, but the number of ADCs 10 is not limited to four. For example, the interleaved AD converting apparatus 100 may convert the analog signal into the digital signal using $2^n$ ADCs 10, where n is a positive integer. In any of these cases, the frequency spectrum of the digital signal can be accurately calculated using the same operation as performed by the interleaved AD converting apparatus 100 of the present embodiment.

The ADCs 10 are each provided with a sampling clock whose phase differs by a prescribed amount for each ADC 10. The sampling clock is described in detail in relation to FIG. 2. Each ADC 10 receives the analog signal as an input signal, and samples the analog signal according to the sampling clock.

Each Fourier transform section 12 is provided to a corresponding ADC 10, performs a Fourier transform on data obtained as a result of the ADC 10 sampling the analog signal, and generates a measurement signal corresponding to the ADC 10. The Fourier transform performed by each Fourier transform section 12 is a discrete Fourier transform.

The measuring section 14 measures the frequency characteristics of each ADC 10 in advance. For example, the measuring section 14 may cause a known analog signal to be input to each ADC 10 and measure the frequency characteristics of each ADC 10 based on the data output by the ADC 10. At this time, the measuring section 14 may measure the frequency characteristics using the sampling clock provided for converting the analog signal into the digital signal. For example, when measuring the frequency characteristics of each ADC 10, the measuring section 14 may supply each ADC 10 with the sampling clock used during actual operation and measure the output of each ADC 10. In this way, the measuring section 14 can measure the frequency characteristics of the sampling by each ADC 10, which include a phase error of the sampling clock supplied thereto.

Each correcting section 16 obtains an ideal measurement signal that would be obtained when the frequency characteristics of the corresponding ADC 10 are ideal, by multiplying the measurement signal by a correction coefficient based on the frequency characteristics of all of the ADCs 10. At this time, the frequency characteristics of one of the ADCs 10 may be set as the ideal frequency characteristics. As a result, each correcting section 16 can generate an ideal measurement signal in which spurious components caused by the error of the frequency characteristics of the ADCs 10 is eliminated.

The interleaving section 18 generates a frequency vector of the digital signal by combining the ideal measurement signals. With this configuration, a frequency spectrum can be obtained in which the spurious component caused by the frequency characteristics of the sampling by the ADCs 10 is eliminated.

Figure 2:
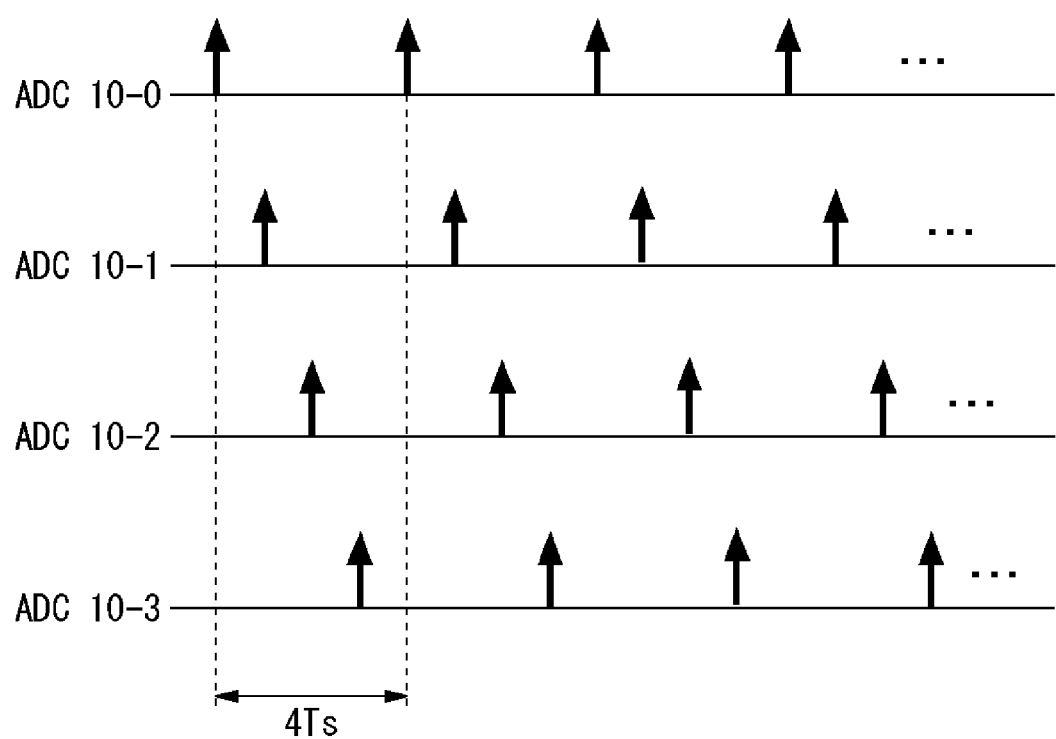
FIG. 2 is used to describe a sampling clock supplied to each of the ADCs 10.

FIG. 2 is used to describe the sampling clock supplied to each of the ADCs 10. When converting an analog signal with a bandwidth of [−½ Ts, 1/(2 Ts)] into a digital signal, for example, each ADC 10 is provided with a sampling clock having a frequency of 1/(4 Ts) and a phase that is sequentially shifted by Ts for each ADC 10. By sampling the analog signal using this sampling clock, the analog signal can be sampled with a rate that is four times the sampling frequency of any one of the ADCs 10.

Figure 3:
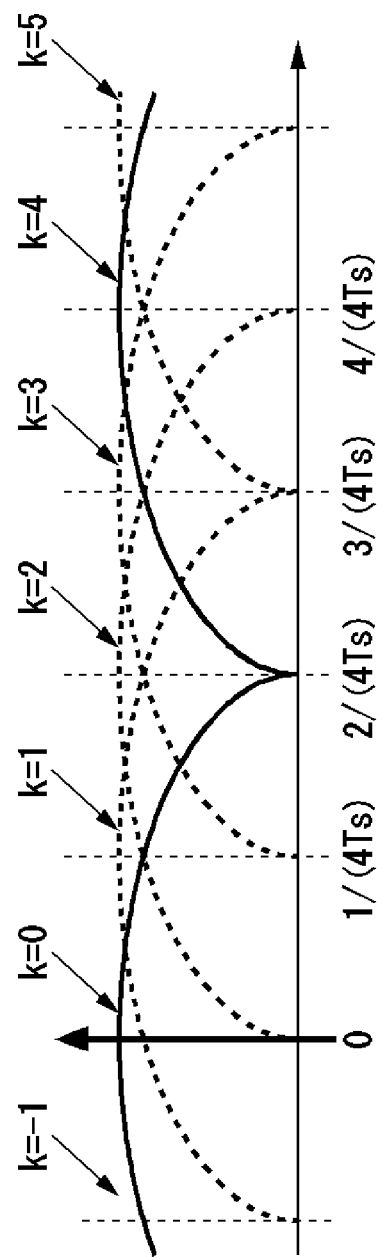
FIG. 3 shows exemplary frequency characteristic information output by each Fourier transform section 12.

FIG. 3 shows exemplary frequency characteristic information output by each Fourier transform section 12. In addition to a signal component (k=0) indicated by the solid line in FIG. 3, spurious components (k=−1, 1, 2, 3, 4, 5) also occur in the measurement signals obtained by sampling the analog signal having a bandwidth of [−½ Ts, 1/(2 Ts)] with a frequency of 1/(4 Ts). Every piece of frequency characteristic information includes the spurious components and the signal component shown in FIG. 3, but since the sampling clock is shifted by Ts for each ADC 10, each component of the frequency characteristic information has a different orientation in complex space.

Figure 4:
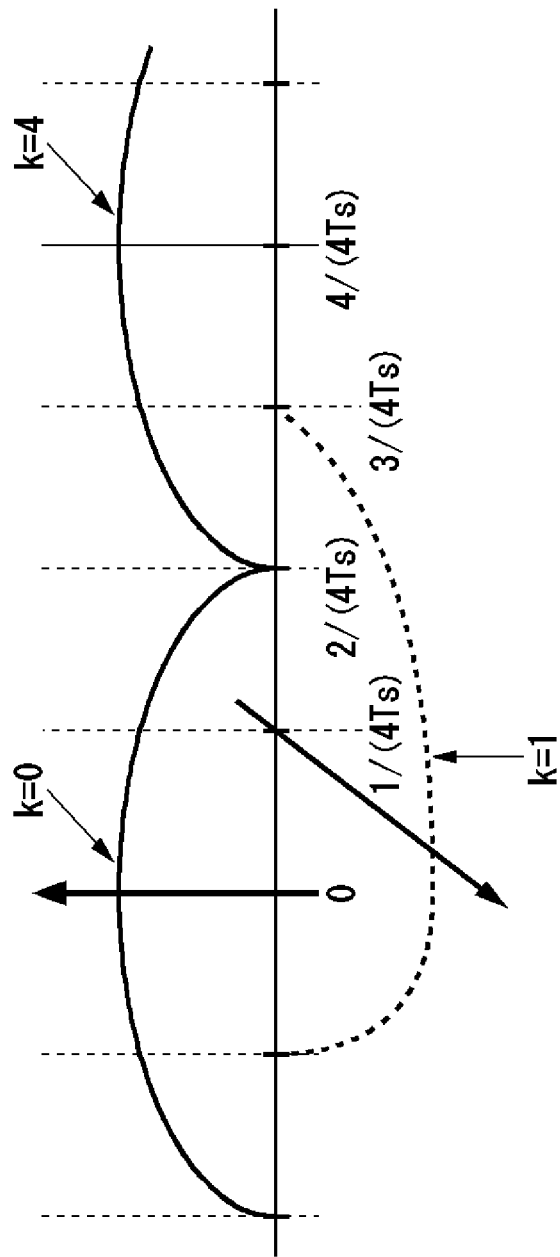
FIG. 4 shows an exemplary portion of the frequency characteristic information output by the Fourier transform section 12-1.

FIG. 4 shows an exemplary portion of the frequency characteristic information output by the Fourier transform section 12-1. When all of the components (k=−1 to 5) of the frequency characteristic information output by the Fourier transform section 12-0 are oriented in the same direction in complex space, as shown in FIG. 3, the signal component (k=0) of the frequency characteristic information output by the Fourier transform section 12-1 is oriented in the same direction as the signal components of the frequency characteristic information output by the Fourier transform section 12-0. However, the phase of the sampling clock of the ADC 10-1 is Ts ahead of the phase of the sampling clock of the ADC 10-0, and therefore the spurious component (k=1) of the frequency characteristic information output by the Fourier transform section 12-1 is rotated by 90 degrees relative to the signal component (k=0). In the same way, the other spurious components (k=2, 3, 4, 5), which are not shown, are sequentially rotated by 90 degrees.

Figure 5:
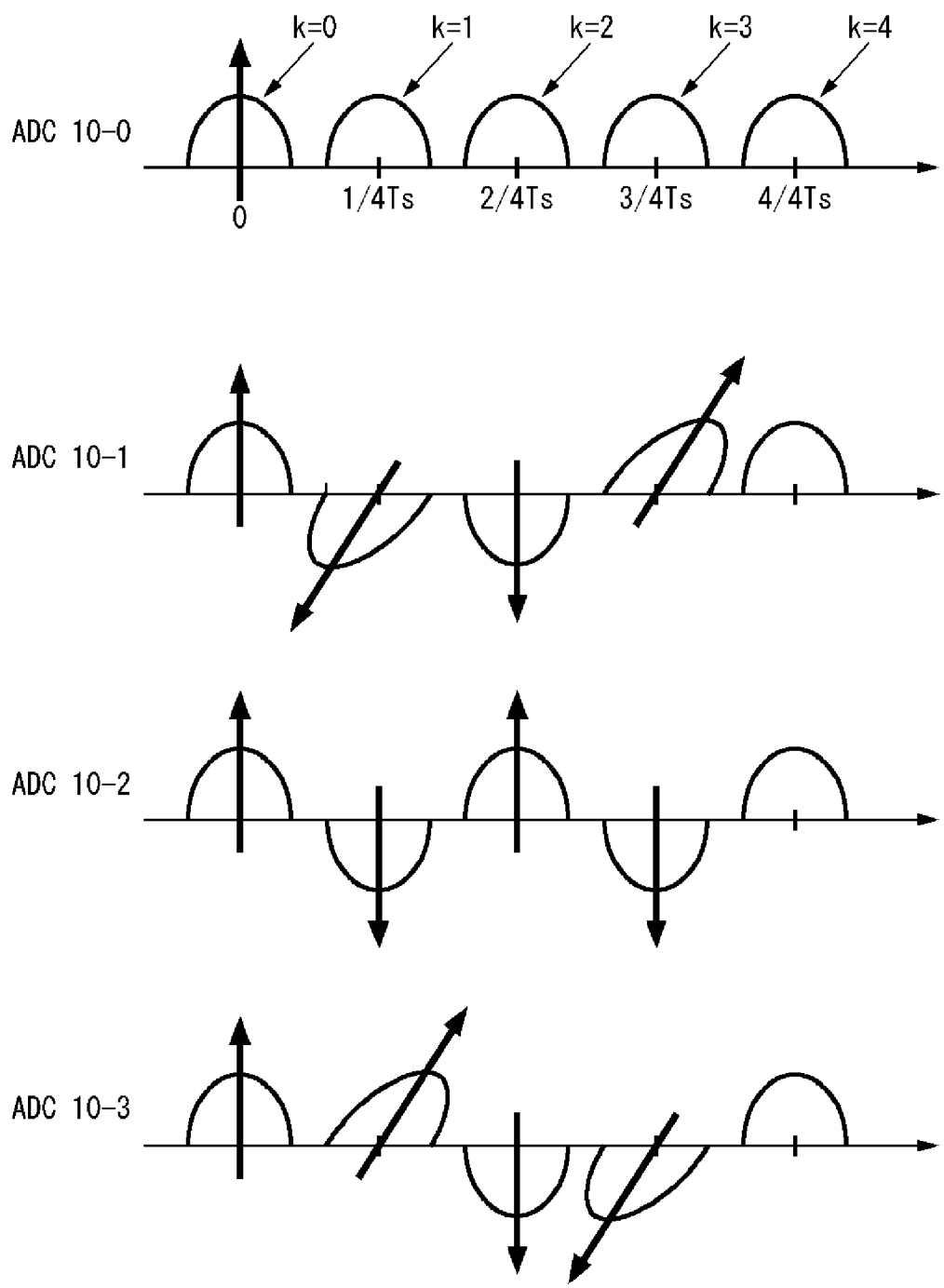
FIG. 5 show an example of the frequency characteristic information displayed in complex space.

FIG. 5 shows an example of frequency characteristic information displayed in complex space. In FIG. 5, the signal components and spurious components are shown discretely, but may instead overlap with each other as shown in the frequency characteristic information of FIG. 3.

As described above, the components of the frequency characteristic information output by the Fourier transform section 12-1 are sequentially rotated by 90 degrees. The phase of the sampling clock of the ADC 10-2 is 2 Ts ahead of the phase of the sampling clock of the ADC 10-0, and therefore the components of the frequency characteristic information output by the Fourier transform section 12-2 are each rotated by 180 degrees, as shown in FIG. 5. In the same way, the phase of the sampling clock of the ADC 10-3 is 3 Ts ahead of the phase of the sampling clock of the ADC 10-0, and therefore the components of the frequency characteristic information output by the Fourier transform section 12-3 are each rotated by 270 degrees, as shown in FIG. 5.

By combining these frequency characteristics, the spurious components (k=−1, 1, 2, 3, 5) of the frequency characteristics cancel out, and only the signal component (k=0) and the aliasing component (k=4) remain. However, the spurious components are not cancelled out if a variation in the angle of the spurious components occurs due to variation in the sampling timings of the ADCs 10 resulting from frequency characteristic errors of the ADCs 10 or phase errors in the sampling clock.

Figure 6:
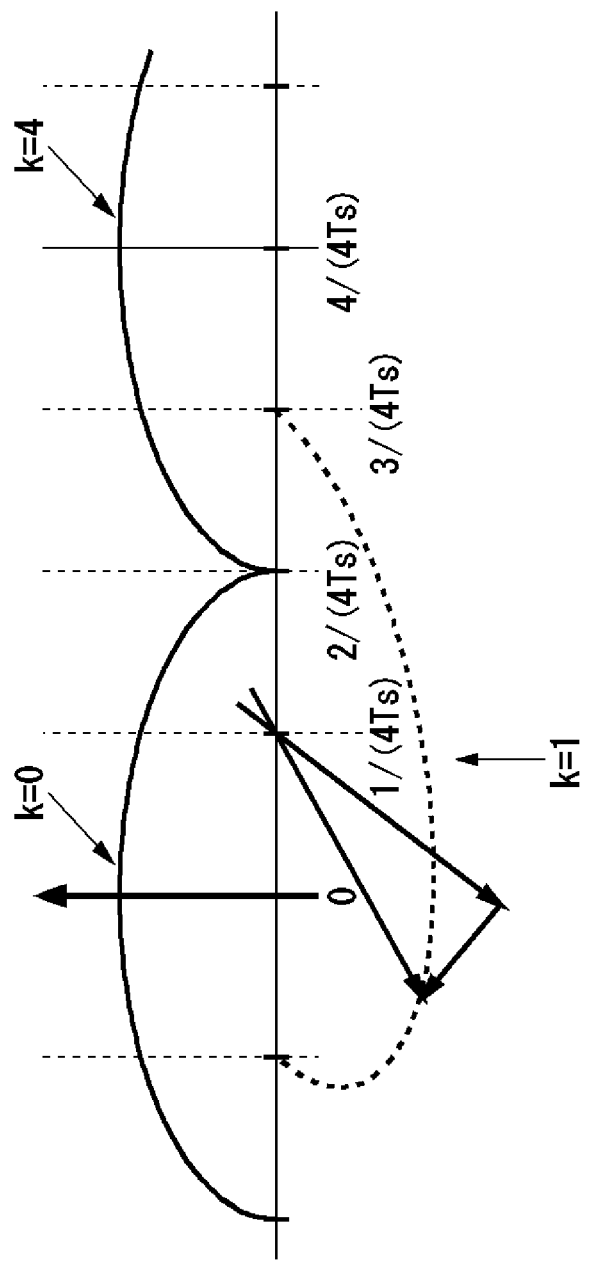
FIG. 6 shows another exemplary portion of the frequency characteristic information output by the Fourier transform section 12-1.

FIG. 6 shows another exemplary portion of the frequency characteristic information output by the Fourier transform section 12-1. As described above, when there is a phase error in the sampling clock supplied to the ADC 10-1 or when the frequency characteristics of the ADC 10-1 are not ideal, variation occurs in the angles of the spurious components, e.g. k=1, as shown in FIG. 6. Therefore, the other spurious component (k=1) of the frequency characteristic information cannot be cancelled out, and so spurious components remain when the frequency characteristic information of each ADC 10 is combined.

The interleaved AD converting apparatus 100 described in FIG. 1 eliminates the spurious components by performing interleaving to correct the variation in the angle of the spurious components caused by the phase error of a sampling clock or the frequency characteristics of the ADCs 10. The following describes a detailed example of the operation of the interleaved AD converting apparatus 100.

Figure 7:
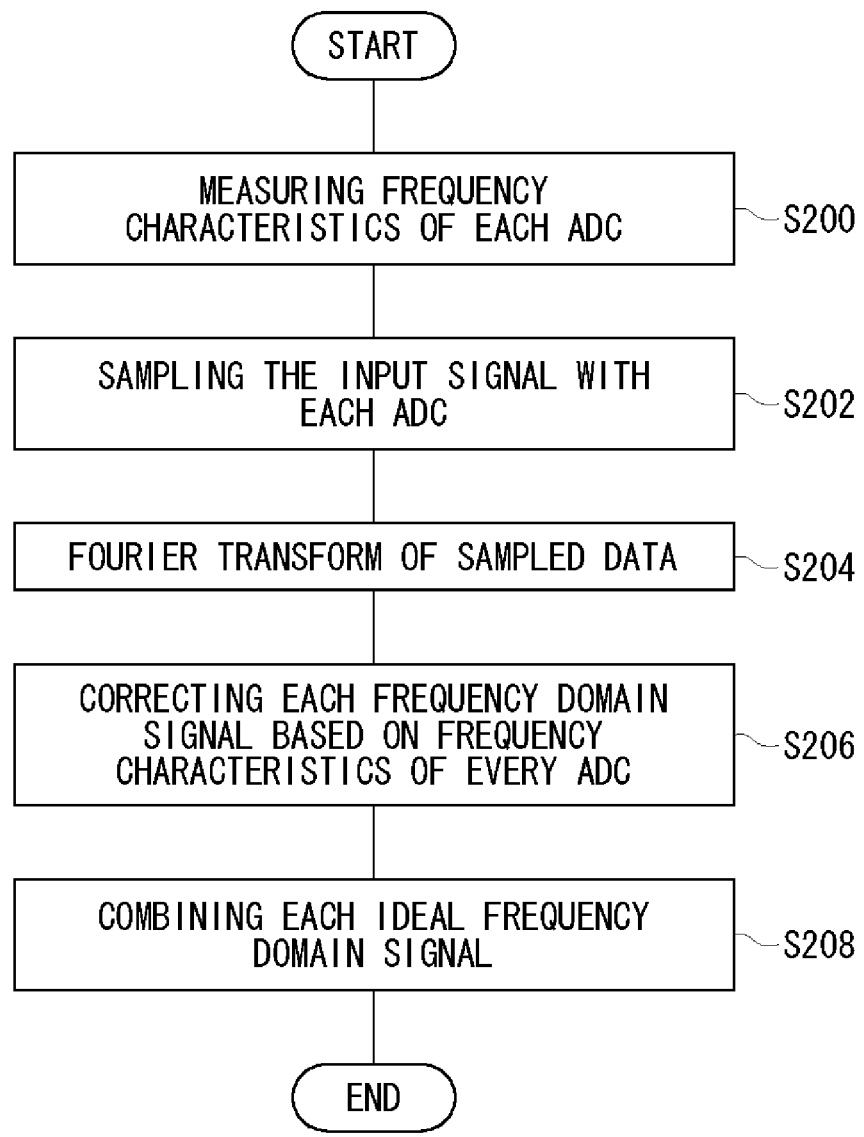
FIG. 7 is a flow chart showing an exemplary operation of the interleaved AD converting apparatus 100.

FIG. 7 is a flow chart showing an exemplary operation of the interleaved AD converting apparatus 100. First, at the measurement step S200, the measuring section 14 measures the frequency characteristics of each ADC 10 in advance. Here, the frequency characteristics of each ADC 10 are calculated as shown below.

$$a_l(k) = \frac{1}{4Ts} a\left(f - \frac{k}{4Ts}\right) e^{-j\pi k l/2}$$

Here, l represents a corresponding ADC 10, and is equal to 0, 1, 2, or 3.

Next, at the sampling step S202, the ADCs 10 are used to sample the analog signal supplied as an input signal. At this time, the sampling clocks $p_0(t)$, $p_1(t)$, $p_2(t)$, and $p_3(t)$ supplied respectively to the ADCs 10 are shown by Expression 1 below.

$$p_0(t) = \sum_{n=-\infty}^{\infty} \delta(t - 4nTs)$$

$$p_1(t) = \sum_{n=-\infty}^{\infty} \delta(t - (4n+1)Ts)$$

$$p_2(t) = \sum_{n=-\infty}^{\infty} \delta(t - (4n+2)Ts)$$

$$p_3(t) = \sum_{n=-\infty}^{\infty} \delta(t - (4n+3)Ts)$$

Expression 1

Next, at the Fourier transform step S204, the Fourier transform sections 12 are used to perform a Fourier transform on the data sampled by each of the ADCs 10 and generate a plurality of measurement signals corresponding respectively to the ADCs 10. At this time, the Fourier transform of each sampling clock shown in Expression 1 is calculated as shown below.

$$P_l(f) = e^{-j2\pi f(lTs)} \frac{1}{4Ts} \sum_{k=-\infty}^{\infty} \delta\left(f - \frac{k}{4Ts}\right)$$

Expression 2

Using Expression 2, the measurement signal $X_l(f)$ output by each Fourier transform section 12 can be calculated as shown below.

$$X_l(f) = \frac{1}{4Ts} \sum_{k=-\infty}^{\infty} X\left(f - \frac{k}{4Ts}\right) e^{-j\pi k l/2}$$

Expression 3

Furthermore, the expression shown below is assumed.

$$\bar{x}(k) = \frac{1}{4Ts} X\left(f - \frac{k}{4Ts}\right)$$

Based on this expression, the measurement signals can be expressed as shown below. It should be noted that in the present embodiment, the frequency characteristics of the ADC 10-0 are used as the ideal frequency characteristics. In other words, $a_0(k)=1$.

$X_0(f) = \bar{x}(-1) + \bar{x}(0) + \bar{x}(1) + \bar{x}(2) + \bar{x}(3) + \bar{x}(4) + \bar{x}(5)$ $X_1(f) = a_1(-1)\bar{x}(-1) + a_1(0)\bar{x}(0) + a_1(1)\bar{x}(1) + a_1(2)\bar{x}(2) + a_1(3)\bar{x}(3) + a_1(4)\bar{x}(4) + a_1(5)\bar{x}(5)$ $X_2(f) = a_2(-1)\bar{x}(-1) + a_2(0)\bar{x}(0) + a_2(1)\bar{x}(1) + a_2(2)\bar{x}(2) + a_2(3)\bar{x}(3) + a_2(4)\bar{x}(4) + a_2(5)\bar{x}(5)$ $X_3(f) = a_3(-1)\bar{x}(-1) + a_3(0)\bar{x}(0) + a_3(1)\bar{x}(1) + a_3(2)\bar{x}(2) + a_3(3)\bar{x}(3) + a_3(4)\bar{x}(4) + a_3(5)\bar{x}(5)$ Expression 4:

Here, fs represents the sampling frequency of each ADC, the terms in the above expressions from k=−1 to k=5 represent the components included in a bandwidth [0, 4 fs] when the bandwidth of X(f) is [−2 fs, 2 fs], and $a_j(k)$ represents a component in the frequency characteristics of the j-th ADC corresponding to $\bar{x}(k)$.

Next, at the correction step S206, each correcting section 16 is used to obtain a measurement signal that occurs when the corresponding ADC 10 has ideal frequency characteristics, by multiplying the corresponding measurement signal by a correction coefficient based on the frequency characteristics of all of the ADCs 10. In the present embodiment, each correcting section 16 multiplies the corresponding frequency characteristics by a correction coefficient that eliminates the spurious components k=−1, 1, 2, 3, 5 and causes only the signal component k=0 and the aliasing component of this signal component to remain, when calculating the linear sum of the frequency components $X_0(f)$ to $X_3(f)$ shown in Expression 4. In other words, the correcting sections 16 multiply the frequency characteristics by the correction coefficients $L_1$, $L_2$, and $L_3$ calculated as shown below.

$X_0(f) + L_1 X_1(f) + L_2 X_2(f) + L_3 X_3(f) = \alpha \bar{x}(0) + \beta \bar{x}(4)$ Expression 5:

In Expression 5, $\alpha$ and $\beta$ are arbitrary real numbers.

At this time, the correcting sections 16 divide the frequency band [−2 fs, 2 fs] of the digital signal to be calculated, according to the number of ADCs 10. The correcting sections 16 of the present embodiment divide this frequency band of the digital signal to be calculated into four regions, which are a first region that has a bandwidth of [0, fs], a second region that has a bandwidth of [fs, 2 fs], a third region that has a bandwidth of [2 fs, 3 fs], and a fourth region that has a bandwidth of [3 fs, 4 fs].

As seen from Expression 4, the spurious components included in the frequency band [−2 fs, 2 fs] of the digital signal are the four components k=−1, 1, 2, 3. As seen from Expression 5, there are no values for the correction coefficients $L_1$, $L_2$, and $L_3$ that can eliminate all four of these spurious components at the same time. However, by dividing the frequency band of the digital signal as described above, each region resulting from the division contains three spurious components, as shown in FIG. 3. Therefore, the correcting section 16 can calculate the correction coefficients for each frequency region in the manner shown below.

Expression 6 is used for the first region, Expression 7 is used for the second and third regions, and Expression 8 is used for the fourth region.

$$\begin{pmatrix} L_1 \\ L_2 \\ L_3 \end{pmatrix} = \begin{pmatrix} a_1(-1) & a_2(-1) & a_3(-1) \\ a_1(1) & a_2(1) & a_3(1) \\ a_1(2) & a_2(2) & a_3(2) \end{pmatrix}^{-1} \begin{pmatrix} -1 \\ -1 \\ -1 \end{pmatrix}$$ Expression 6

$$\begin{pmatrix} L_1 \\ L_2 \\ L_3 \end{pmatrix} = \begin{pmatrix} a_1(1) & a_2(1) & a_3(1) \\ a_1(2) & a_2(2) & a_3(2) \\ a_1(3) & a_2(3) & a_3(3) \end{pmatrix}^{-1} \begin{pmatrix} -1 \\ -1 \\ -1 \end{pmatrix}$$ Expression 7

$$\begin{pmatrix} L_1 \\ L_2 \\ L_3 \end{pmatrix} = \begin{pmatrix} a_1(2) & a_2(2) & a_3(2) \\ a_1(3) & a_2(3) & a_3(3) \\ a_1(5) & a_2(5) & a_3(5) \end{pmatrix}^{-1} \begin{pmatrix} -1 \\ -1 \\ -1 \end{pmatrix}$$ Expression 8

At the combining step S208, the interleaving section 18 is used to generate the frequency spectrum of the digital signal by combining the measurement signals acquired at the correction step S206. Since the measurement signals are multiplied by the calculated correction coefficients $L_1$, $L_2$, and $L_3$ at the correction step S206, the phases of the signal component (k=0) and the aliasing component (k=4) change. Therefore, correction coefficients for correcting this change are also calculated at the correction step S206.

In the present embodiment, the correction step S206 includes a first calculation step for calculating first correction coefficients and a second calculation step for calculating second correction coefficients. The first calculation step includes calculating, based on the frequency characteristics of all of the ADCs 10, the first correction coefficients $L_1$, $L_2$, and $L_3$ that are each multiplied by the corresponding measurement signal to cancel out the spurious components of the measurement signals caused by the frequency characteristics of the ADCs 10. The first calculation step further includes calculating, for each of the divided regions obtained by dividing the frequency band as described above, first correction coefficients $L_1$, $L_2$, and $L_3$ that cancel out the spurious components in the divided region, from among the spurious components of the frequency signal.

The second calculation step includes calculating, for each of the divided regions, a second correction coefficient for correcting the phase error of the signal components and the aliasing components of the measurement signals caused by the multiplication with the first correction coefficients, based on the frequency characteristics and the first correction coefficients. Since only the signal component (k=0) remains in the first and second regions, the second correction coefficients for the first and second regions can be calculated as $1/(1+a_1(0)L_1+a_2(0)L_2+a_3(0)L_3)$. Furthermore, since only the aliasing component (k=4) remains in the third and fourth regions, the second correction coefficients for the third and fourth regions can be calculated as $1/(1+a_1(4)L_1+a_2(4)L_2+a_3(4)L_3)$.

At the combining step S208, the second correction coefficients are multiplied by the signals resulting from the combination of the measurement signals at the correction step S206. In the present embodiment, the multiplication by the second correction coefficients is performed at the combining step S208, but as another example, this multiplication may be performed at the correction step S206. In other words, at the correction step S206, each measurement signal may be multiplied by the first correction coefficients and the second correction coefficient.

As described above, at the combining step S208, the frequency vector of the digital signal is calculated for each region based on the expressions shown below. Specifically, Expression 9 is used for the first and second regions and Expression 10 is used for the third and fourth regions.

$$X'(f) = \frac{1}{1 + a_1(0)L_1 + a_2(0)L_2 + a_3(0)L_3} \{X_0(f) + L_1 X_1(f) + L_2 X_2(f) + L_3 X_3(f)\}$$ Expression 9

$$X'(f) = \frac{1}{1 + a_1(4)L_1 + a_2(4)L_2 + a_3(4)L_3} \{X_0(f) + L_1 X_1(f) + L_2 X_2(f) + L_3 X_3(f)\}$$ Expression 10

In other words, the combining step S208 includes calculating the frequency spectrum in the first region by using, in Expression 9, the correction coefficients $L_1$, $L_2$, and $L_3$ calculated based on Expression 6. The combining step S208 further includes calculating the frequency spectrum in the second region by using, in Expression 9, the correction coefficients $L_1$, $L_2$, and $L_3$ calculated based on Expression 7, calculating the frequency spectrum in the third region by using, in Expression 10, the correction coefficients $L_1$, $L_2$, and $L_3$ calculated based on Expression 7, and calculating the frequency spectrum in the fourth region by using, in Expression 10, the correction coefficients $L_1$, $L_2$, and $L_3$ calculated based on Expression 8. This process can be used to obtain a frequency spectrum from which the spurious components are eliminated.

In the present embodiment, the frequency characteristics of the ADC 10-0 are used as the ideal frequency characteristics. Even if the frequency characteristics of the ADC 10-0 are not ideal, as long as the ADC 10-0 has some kind of frequency characteristics, the correction can be performed based on the frequency characteristics in the same manner to remove the spurious components.

In this case, the correction can be performed by setting the frequency characteristics $a_1(k)$ of other ADCs 10 to be equal to the result of dividing the frequency characteristics of the other ADCs 10 by the frequency characteristics of the ADC 10-0. In other words, when the frequency characteristic measured in advance for each ADC 10-$l$ (l=0, 1, 2, 3) are expressed as Fad(l), the frequency characteristics $a_1(k)$ used in the correction can be expressed as shown below.

$a_0(k)$=Fad(0)

$a_1(k)$=Fad(1)/Fad(0)

$a_2(k)$=Fad(2)/Fad(0)

$a_3(k)$=Fad(3)/Fad(0)   Expression 11:

Using the frequency characteristics shown in Expression 11, Expressions 9 and 10 can be expressed as shown below.

$$X'(f) = \frac{1}{a_0(0)} \cdot \frac{1}{1 + a_1(0)L_1 + a_2(0)L_2 + a_3(0)L_3} \quad \text{Expression 9}$$
$$\{X_0(f) + L_1 X_1(f) + L_2 X_2(f) + L_3 X_3(f)\}$$

$$X'(f) = \frac{1}{a_0(4)} \cdot \frac{1}{1 + a_1(4)L_1 + a_2(4)L_2 + a_3(4)L_3} \quad \text{Expression 10}$$
$$\{X_0(f) + L_1 X_1(f) + L_2 X_2(f) + L_3 X_3(f)\}$$

In the above description, the analog signal is a complex signal. However, if the analog signal is a real signal, only the operations corresponding to the first and second regions in the correction method are applied. For example, at the combining step S208, the frequency spectrum in the first and second region is calculated by using the correction coefficients calculated based on Expression 6 or 7 in Expression 9, and the complex conjugate of the frequency spectrum in the first and second regions is calculated to be the frequency spectrum in the third and fourth regions.

The present embodiment describes a calculating a frequency spectrum with a bandwidth of [0, 4 fs], but the same operation can be performed for a bandwidth of [−2 fs, 2 fs]. For example, the spurious components can be eliminated using the same operation by setting a bandwidth of [−fs, 0] as the third region and a bandwidth of [−2 fs, −fs] as the fourth region.

Each of the frequency characteristics can be calculated as shown below, with the frequency characteristic a(0) of k=0 as a reference.

a(−1): Shift a(0) by −fs/4 a(1): Shift a(0) by fs/4 a(2): Shift a(0) by 2 fs/4 a(3): Shift a(0) by 3 fs/4 a(5): Shift a(0) by 5 fs/4

When the Fourier transform performed by the Fourier transform sections 12 is a discrete Fourier transform, the discrete Fourier transform of the sampling clock shown by Expression 1 can be expressed as shown below.

$$DFT_0(k) = \sum_{n=0}^{(N/4)-1} x(4nTs) e^{-j2\pi kn/\frac{N}{4}} \quad \text{Expression 11}$$

$$DFT_1(k) = \sum_{n=0}^{(N/4)-1} x((4n+1)Ts) e^{-j2\pi kn/\frac{N}{4}}$$

$$DFT_2(k) = \sum_{n=0}^{(N/4)-1} x((4n+2)Ts) e^{-j2\pi kn/\frac{N}{4}}$$

$$DFT_3(k) = \sum_{n=0}^{(N/4)-1} x((4n+3)Ts) e^{-j2\pi kn/\frac{N}{4}}$$

Each measurement signal after the discrete Fourier transform can be expressed as shown below.

$$X_l\left(\frac{k}{NTs}\right) = \sum_{n=0}^{(N/4)-1} x((4n+l)Ts) e^{-j2\pi f((4n+l)Ts)}$$

$$= e^{-j2\pi kl/N} \sum_{n=0}^{(N/4)-1} x((4n+l)Ts) e^{-j2\pi kn/\frac{N}{4}}$$

$$= e^{-j2\pi kl/N} DFT_l(k)$$

Therefore, Expressions 9 and 10 can be expressed as shown below.

$$X'(f) = \frac{1}{1 + a_1(0)L_1 + a_2(0)L_2 + a_3(0)L_3} \quad \text{Expression 9'}$$
$$(DFT_0(k) + L_1 \cdot e^{-j2\pi k \cdot 1/N} \cdot DFT_1(k) +$$
$$L_2 \cdot e^{-j2\pi k \cdot 2/N} \cdot DFT_2(k) + L_3 \cdot e^{-j2\pi k \cdot 3/N} DFT_3(k))$$

$$X'(f) = \frac{1}{1 + a_1(4)L_1 + a_2(4)L_2 + a_3(4)L_3} \quad \text{Expression 10'}$$
$$(DFT_0(k) + L_1 \cdot e^{-j2\pi k \cdot 1/N} \cdot DFT_1(k) +$$
$$L_2 \cdot e^{-j2\pi k \cdot 2/N} \cdot DFT_2(k) + L_3 \cdot e^{-j2\pi k \cdot 3/N} DFT_3(k))$$

The present embodiment includes four ADCs 10, but a frequency component from which the spurious components are eliminated can be calculated in the same way when N ADCs 10 are included, where N is an integer greater than 1. For example, Expressions 4, 5, 9, and 10 can be expressed as shown below.

$$X_0(f) = \bar{x}(-l) + \bar{x}(-l+1) + \ldots + \bar{x}(m-1) + \bar{x}(m) \quad \text{Expression 4'}$$

$$X_1(f) =$$
$$a_1(-l)\bar{x}(-l) + a_1(-l+1)\bar{x}(-l+1) + \ldots + a_1(m-1)\bar{x}(m)$$

$$\vdots$$

$$X_{N-1}(f) = a_{N-1}(-l)\bar{x}(-l) +$$
$$a_{N-1}(-l+1)\bar{x}(-l+1) + \ldots + a_{N-1}(m-1)\bar{x}(m)$$

Here, the terms from −l to m represent components included in the bandwidth [0, Nfs] when the bandwidth of X(f) is [−Nfs/2, Nfs/2], where fs is the sampling frequency of each ADC, and $a_j(k)$ represents the components of the frequency characteristics of the j-th ADC that correspond to $\bar{x}(k)$.

$$X_0(f) + L_1 X_1(f) + L_2 X_2(f) + \ldots + L_{N-1} X_{N-1}(f) = \alpha \bar{x}(0) + \beta \bar{x}(u) \quad \text{Expression 5':}$$

Here, α and β are arbitrary real numbers, and x(u) is the aliasing component of x(0).

$$X'(f) = \frac{1}{1 + a_1(0)L_1 + a_2(0)L_2 + \ldots + a_{N-1}(0)L_{N-1}} \quad \text{Expression 9''}$$
$$\{X_0(f) + L_1 X_1(f) + L_2 X_2(f) + \ldots + L_{N-1} X_{N-1}(f)\}$$

$$X'(f) = \frac{1}{1 + a_1(u)L_1 + a_2(u)L_2 + \ldots + a_{N-1}(u)L_{N-1}} \quad \text{Expression 10''}$$
$$\{X_0(f) + L_1 X_1(f) + L_2 X_2(f) + \ldots + L_{N-1} X_{N-1}(f)\}$$

When n points of sampling data are acquired by the ADCs 10, each Fourier transform section 12 receives n/N points of data, where N is the number of ADCs 10. In the following example, N=4. Therefore, when the sampling frequency of all four ADCs 10 is f, each Fourier transform section 12 outputs a frequency domain signal with a bandwidth from 0 to f/4. In contrast, the interleaving section 18 outputs a frequency domain signal with a bandwidth from 0 to f. As a result, the correcting sections 16 preferably perform a correction by compensating for the above difference in bandwidth.

Figure 8A:
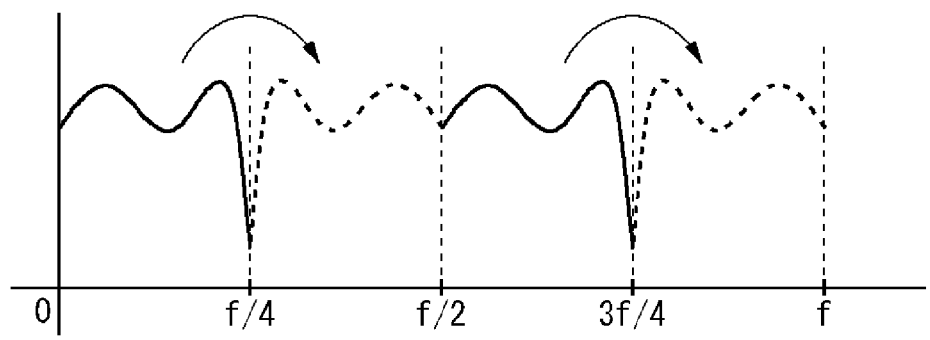
FIG. 8A shows an exemplary bandwidth compensation performed by a correcting section 16.
Figure 8B:
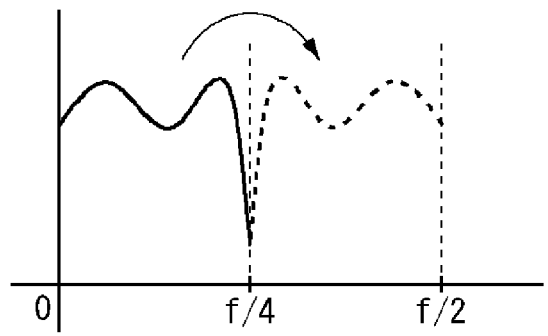
FIG. 8B shows another exemplary bandwidth compensation performed by a correcting section 16.
Figure 8C:
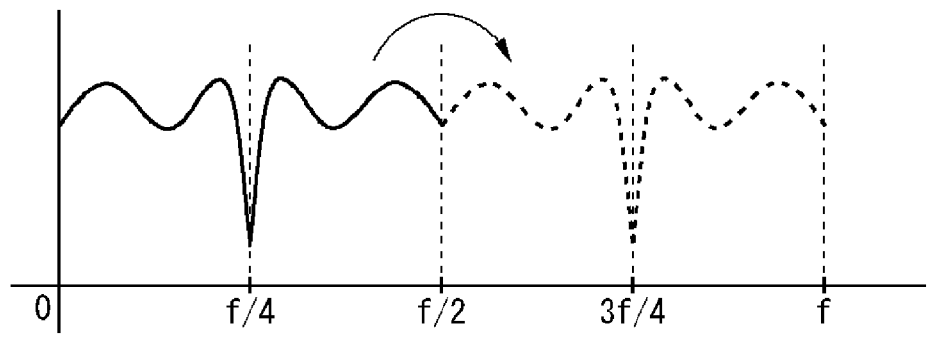
FIG. 8C shows an exemplary bandwidth compensation performed by the interleaving section 18 after each correcting section 16 performs the bandwidth compensation described in relation to FIG. 8B.

FIG. 8A shows an exemplary bandwidth compensation performed by a correcting section 16. In FIGS. 8A, 8B, and 8C, the signal components and image components are shown by solid lines, and the complex conjugate components thereof are shown by dashed lines. As described above, each correcting section 16 receives a frequency domain signal with a bandwidth from 0 to f/4. An image component appears in the bandwidth from f/2 to 3 f/4. Each correcting section 16 generates the complex conjugate of the image component and the frequency domain signal. Each correcting section 16 forms each of the complex conjugate components to be mirror copies of the signal components over borders at f/4 and 3 f/4. As a result, a frequency domain signal with a bandwidth from 0 to f can be generated.

Each correcting sections 16 may perform the correction described in relation to FIGS. 1 to 7 on the frequency domain signal whose bandwidth has been compensated. A signal with a bandwidth from 0 to f can be generated by the interleaving section 18 combining the frequency domain signals corrected by the correcting sections 16.

FIG. 8B shows another example of bandwidth compensation by each correcting section 16. As shown in FIG. 8B, the correcting section 16 of the present embodiment generates a complex conjugate component for a frequency domain signal having a bandwidth from 0 to f/4. The correcting section 16 forms the complex conjugate component to be a mirror copy of the signal component over a border at f/4. In this way, a frequency component signal with a bandwidth from 0 to f/2 can be generated. The correcting section 16 may perform the correction described in relation to FIGS. 1 to 7 on the frequency component signal having the compensated bandwidth. In the example of FIG. 8B, the bandwidth is further compensated by the interleaving section 18.

FIG. 8C shows an exemplary bandwidth compensation performed by the interleaving section 18 after the bandwidth compensation performed by the correcting sections 16 described in relation to FIG. 8B. As described above, each correcting section 16 outputs a frequency domain signal with a bandwidth from 0 to 2 f. The interleaving section 18 combines these frequency domain signals to generate a composite signal with a bandwidth from 0 to 2 f. The interleaving section 18 then forms the complex conjugate component of the composite signal to be a mirror copy of the signal component over the border at f/2. As a result, a composite signal with a bandwidth from 0 to f can be generated.

Figure 9:
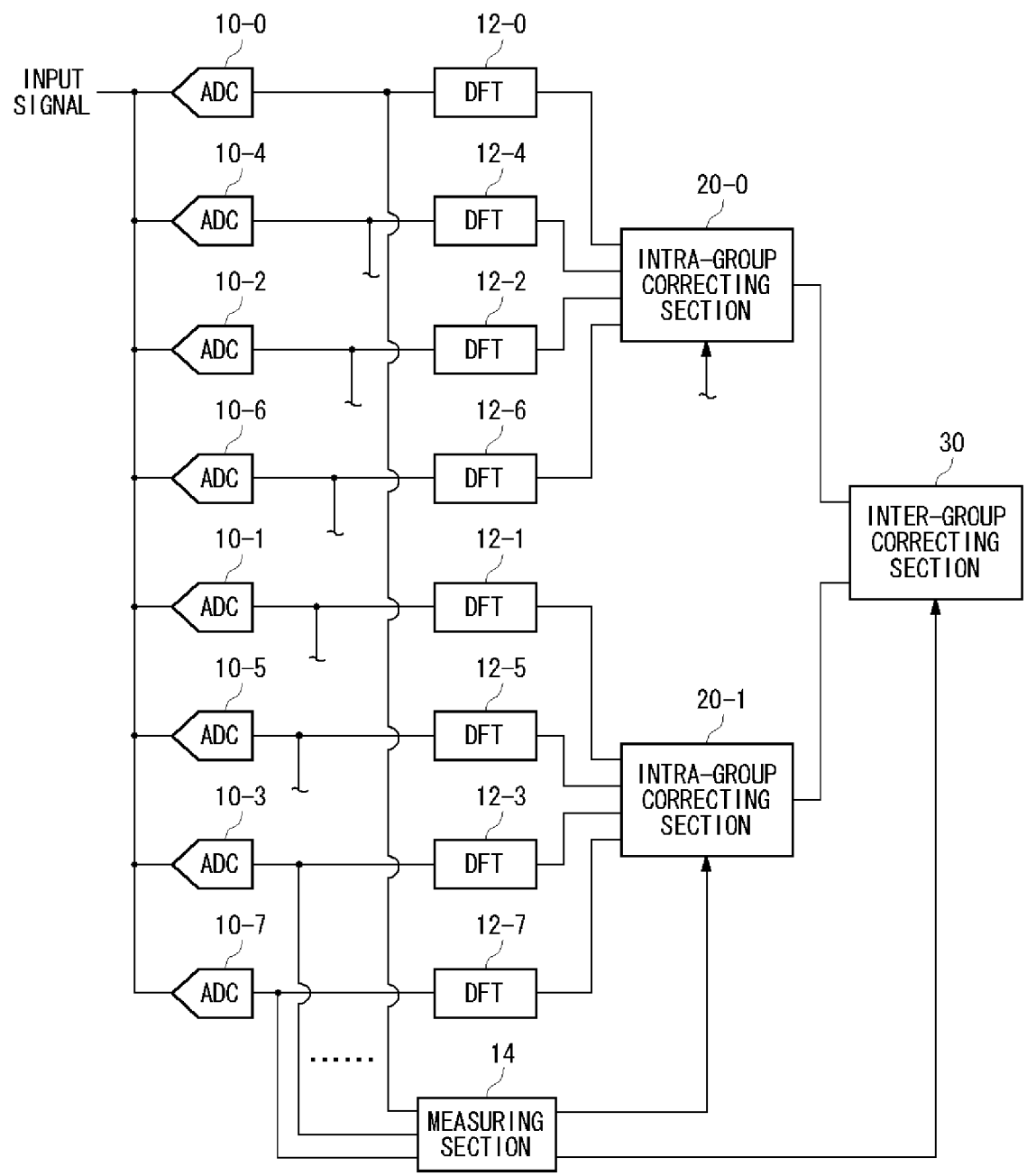
FIG. 9 shows another exemplary configuration of the interleaved AD converting apparatus 100.

FIG. 9 shows another exemplary configuration of the interleaved AD converting apparatus 100. The interleaved AD converting apparatus 100 of the present embodiment includes a plurality of ADCs 10-0 to 10-7, a plurality of Fourier transform sections 12-0 to 12-7, a plurality of intra-group correcting sections 20-0 to 20-1, an inter-group correcting section 30, and a measuring section 14. The ADCs 10, the Fourier transform sections 12, and the measuring section 14 have the same function as the ADCs 10, the Fourier transform sections 12, and the measuring section 14 described in relation to FIG. 1.

Each intra-group correcting section 20 is provided for a group obtained by dividing the plurality of measurement signals into a plurality of groups. Each intra-group correcting section 20 performs the correction described in relation to FIGS. 1 to 7 on the corresponding group of measurement signals. In other words, each intra-group correcting section 20 generates a measurement signal that would be obtained when the corresponding ADCs 10 have ideal frequency characteristics, by multiplying each measurement signal by a correction coefficient based on the frequency characteristics of all of the ADCs 10 in the corresponding group. Each intra-group correcting section 20 may receive the frequency characteristic information for the corresponding ADCs 10 from the measuring section 14.

More specifically, each intra-group correcting section 20 calculates the first correction coefficients L described in relation to Expressions 5 and 8 for the corresponding group. Furthermore, each intra-group correcting section 20 calculates the second correction coefficients described in relation to Expressions 9 and 10 for the corresponding group. Each intra-group correcting section 20 uses the first and second correction coefficients to perform the correction described in relation to Expressions 9 and 10 for the corresponding group. Each intra-group correcting section 20 may combine the corrected measurement signals as described in relation to Expressions 9 and 10, and output the result.

Since each intra-group correcting section 20 performs the correction described in relation to FIGS. 1 to 7 in this way, the measurement signals are preferably divided into groups that each include a number of measurement signals equal to a power of two. Furthermore, each group preferably includes the same number of measurement signals.

The measurement signals are preferably divided such that the measurement signals within a group have uniform relative phase differences therebetween and such that the relative phase differences between measurement signals is the same in each group. In the present embodiment, the measurement signals are divided into a group corresponding to the ADCs 10-0, 10-4, 10-2, and 10-6 and a group corresponding to the ADCs 10-1, 10-5, 10-3, and 12-7.

The ADCS 10-0 to 10-7 are supplied with a sampling clock whose phase is sequentially shifted by a prescribed amount for each ADC 10, in the same manner as in the example of FIG. 2. For example, with the period of the sampling clock expressed as 8 Ts, an ADC 10-$m$ is provided with a sampling clock whose phase is delayed by m×Ts relative to the sampling clock of the ADC 10-0. By dividing the measurement signals as described above, each group can include four measurement signals, which means each group contains the same number of measurement signals and that number is a power of two. Furthermore, the measurement signals in each group have uniform relative phase differences of 2 Ts therebetween, and this relative phase difference of 2 Ts is the same in each group.

Each intra-group correcting section 20 may correct the measurement signals of the corresponding group using the frequency characteristics of one of the ADCs 10 in the group as a reference. In the present embodiment, the intra-group correcting section 20-0 uses the measurement signal corresponding to the ADC 10-0 as a reference and the intra-group correcting section 20-1 uses the measurement signal corresponding to the ADC 10-1 as a reference.

The inter-group correcting section 30 generates the frequency spectrum of the digital signal by combining the frequency characteristics of the groups, based on the difference in frequency characteristics between the groups that are corrected by the intra-group correcting sections 20. The inter-group correcting section 30 may correct the frequency characteristics of each group using the frequency characteristics of one of the groups as a reference.

For example, the inter-group correcting section 30 may correct the frequency characteristics of each group using the frequency characteristics of the group corresponding to the intra-group correcting section 20-0 as a reference. In the present embodiment, the group corresponding to the intra-group correcting section 20-0 is corrected according to the frequency characteristics of the ADC 10-0 and the group corresponding to the intra-group correcting section 20-1 is corrected according to the frequency characteristics of the ADC 10-1. Therefore, the inter-group correcting section 30 may correct the measurement signals of each group based on the frequency characteristics of the ADC 10-0 and the ADC 10-1. The measuring section 14 may supply the inter-group correcting section 30 with the frequency characteristic information for the ADCs 10 that are used as references by the intra-group correcting sections 20.

The inter-group correcting section 30 may correct the signal output by each intra-group correcting section 20 using the same method described in relation to FIGS. 1 to 7, while treating each signal output by an intra-group correcting section 20 as a measurement signal. With this configuration as well, a signal in which the frequency characteristic differences of the ADCs 10 are compensated for can be generated. In the method described in relation to FIGS. 1 to 7, in order to calculate the first and second correction coefficients, an (N−1)-dimensional matrix operation must be performed, where N is the number of ADCs 10. With the interleaved AD converting apparatus 100 of the present embodiment, however, the intra-group correcting sections 20 can perform an ((N/k)−1)-dimensional matrix operation, where k is the number of groups, and the inter-group correcting section 30 can perform a (k−1)-dimensional matrix operation. Therefore, the number of dimensions in the matrix operation can be reduced, and the correction coefficients can be calculated with a simple computation.

Figure 10:
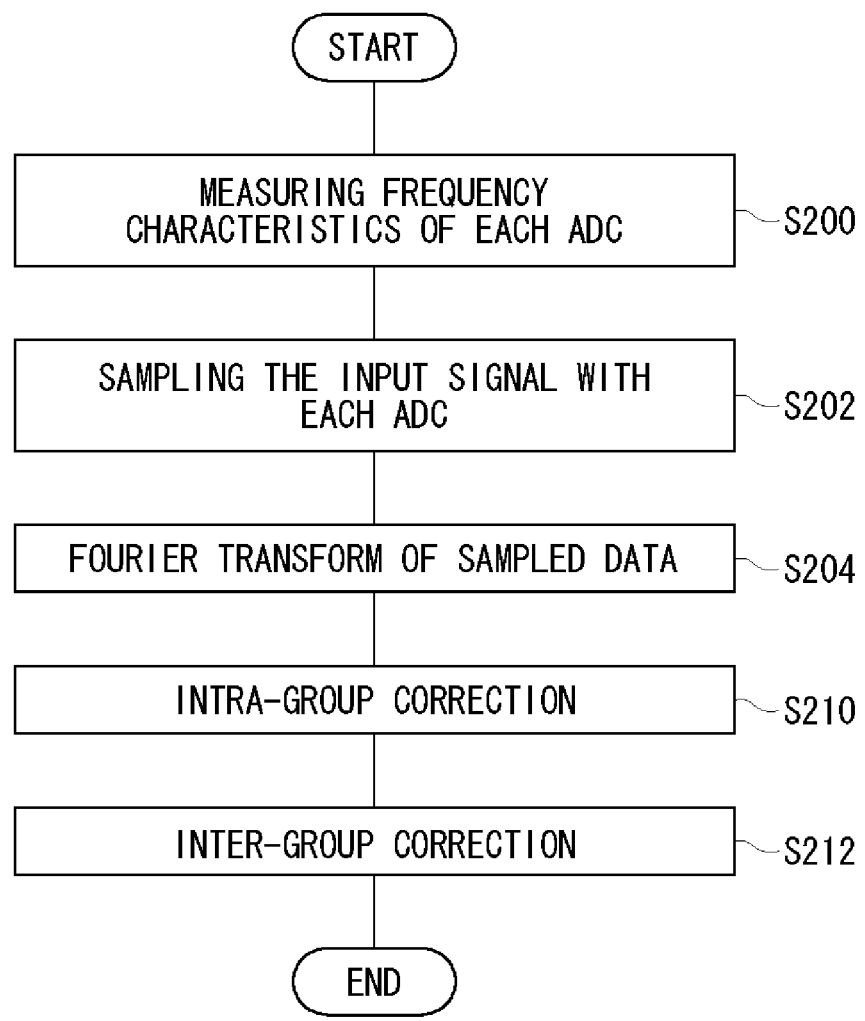
FIG. 10 is a flow chart showing an exemplary operation of the interleaved AD converting apparatus 100 shown in FIG. 9.

FIG. 10 is a flow chart showing an exemplary operation of the interleaved AD converting apparatus 100 shown in FIG. 9. First, the interleaved AD converting apparatus 100 of the present embodiment performs the processes from S200 to S204 described in relation to FIG. 7.

At the intra-group correction step S210, the intra-group correcting sections 20 correct the measurement signals in each group. At S210, the processes from S206 to S208 described in relation to FIG. 7 are performed for each group.

At the inter-group correction step S212, the inter-group correcting section 30 corrects the measurement signals based on the frequency characteristic differences between each group. At S212, the processes from S206 to S208 are performed using the output of each intra-group correcting section 20 as one measurement signal. As a result of this operation, the frequency characteristic differences can be compensated for using a simple process.

Figure 11:
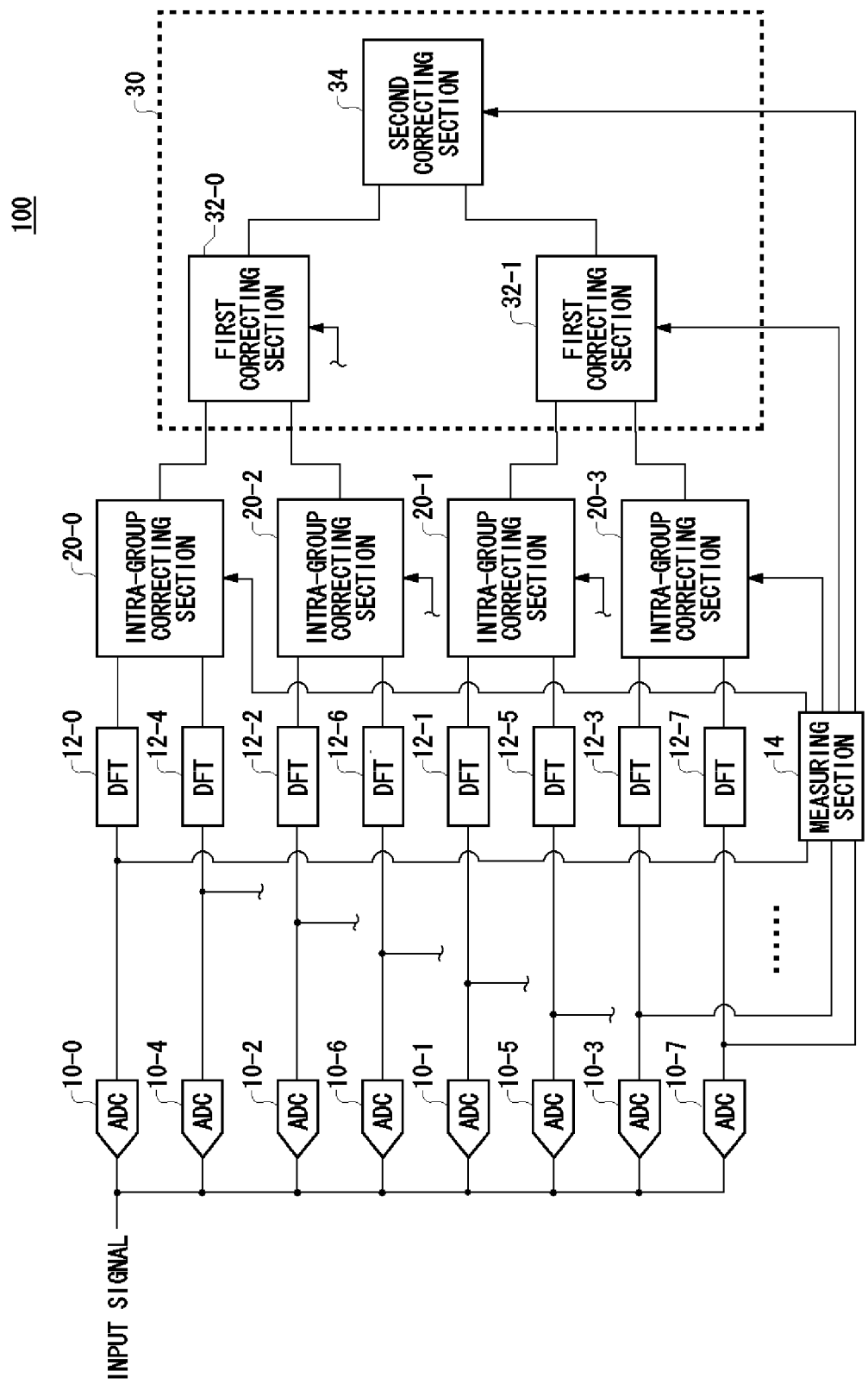
FIG. 11 shows another exemplary configuration of the interleaved AD converting apparatus 100.

FIG. 11 shows another exemplary configuration of the interleaved AD converting apparatus 100. The interleaved AD converting apparatus 100 of the present embodiment includes a plurality of correction stages, and a frequency characteristic difference between two channels is corrected at each correction stage. In this case, each intra-group correcting section 20 functions as a first correction stage, and the inter-group correcting section 30 functions as the following correction stages.

The interleaved AD converting apparatus 100 of the present embodiment includes one intra-group correcting section 20 for every two ADCs 10. Therefore, each intra-group correcting section 20 corrects the frequency characteristic difference between a pair of measurement signals.

In the present embodiment, the ADCs 10 correspond to the intra-group correcting sections 20 in a manner such that the phase difference between each pair of ADCs 10 corresponding to an intra-group correcting section 20 is the same. For example, the ADCs 10 are paired together such that the relative phase difference between each pair of ADCs 10, which is 4 Ts in the present embodiment, is approximately half of the period of the sampling clock, which is 8 Ts in the present embodiment.

More specifically, the pairing of the ADCs 10 may be determined based on results obtained by expressing the integer identifying the ADC 10 in binary and reversing the order of the bits. For example, the integers 0 and 1 are expressed as 000 and 001 in binary. Reversing these bits results in the binary values 000 and 100. Since these binary values correspond to integer values of 0 and 4, the intra-group correcting section 20-0 is set to correspond to a pair including the ADC 10-0 and the ADC 10-4.

In the same way, the integer values 2 and 3 are expressed as 010 and 011 in binary. Reversing these bits results in the binary values 010 and 110. Since these binary values correspond to integer values of 2 and 6, the intra-group correcting section 20-2 is set to correspond to a pair including the ADC 10-2 and the ADC 10-6. In the same way, the intra-group correcting section 20-1 corresponds to the ADCs 10-1 and 10-5, and the intra-group correcting section 20-3 corresponds to the ADCs 10-3 and 10-7.

Each intra-group correcting section 20 may correct the corresponding measurement signals using the frequency characteristics of the ADC 10 corresponding to one of the measurement signals as a reference. Each intra-group correcting section 20 is provided with the frequency characteristic information of the corresponding ADCs 10 by the measuring section 14. The process performed by each intra-group correcting section 20 may be the same as the process described in relation to FIGS. 1 to 7, with the number of ADCs 10 being two.

The inter-group correcting section 30 divides the groups output by the intra-group correcting sections 20 into pairs of corresponding groups, corrects the frequency characteristic difference between each pair of groups based on the frequency characteristic difference between the pair of groups, and generates a new group by combining the pair of groups. The inter-group correcting section 30 repeats this group combining process until only one group remains.

The inter-group correcting section 30 includes a plurality of stages of correcting sections. The inter-group correcting section 30 of the present embodiment includes a plurality of first correcting sections 32 and a second correcting section 34 provided in two stages. Each first correcting section 32 receives the output of two corresponding intra-group correcting sections 20 and corrects this output based on the frequency characteristic difference between the corresponding ADCs 10. For example, the first correcting section 32-0 corrects each signal output by the intra-group correcting section 20-0 and the intra-group correcting section 20-2 based on the frequency characteristic difference between the ADC 10-0 used as the reference by the intra-group correcting section 20-0 and the ADC 10-2 used as the reference by the intra-group correcting section 20-2. The process performed by each first correcting section 32 may be the same as the process described in relation to FIGS. 1 to 7, with the number of ADCs 10 being two. Determining which intra-group correcting sections 20 correspond to each first correcting section 32 may be performed with the same conditions used to determine the ADC 10 pairings.

The second correcting section 34 receives the output from the two first correcting sections 32 and corrects the outputs based on the frequency characteristic difference between the corresponding ADCs 10. The process performed by the second correcting section 34 may be the same as the process described in relation to FIGS. 1 to 7, with the number of ADCs 10 being two.

With this configuration, the matrix operation performed by each correcting section is a 1-dimensional matrix operation. Therefore, the frequency characteristic differences can be compensated for using a simple process. Furthermore, since each correcting section performs the same process, the correcting sections can all have the same configuration. In this case, the correction coefficients used by the correcting sections may each be set independently.

In FIGS. 1 to 7, the frequency domain is divided according to the number of ADCs 10 and the correction coefficients are then calculated. In the present embodiment, since signals from two channels are input to each correcting section, each correcting section divides the frequency domain into two regions and calculates the correction coefficients. However, when the frequency domain is divided into two regions, the boundary of each region is the Nyquist frequency, and therefore the divided regions are complex conjugates. In other words, the correction coefficients calculated according to Expressions 5 and 10 are the same in each region. Therefore, the interleaved AD converting apparatus 100 of the present may calculate the correction coefficients for each correcting section without dividing the frequency domain. Instead, the correction coefficients calculated for one of the divided frequency regions may be used for other frequency regions. Therefore, the frequency characteristic difference can be calculated using an even simpler process.

Figure 12:
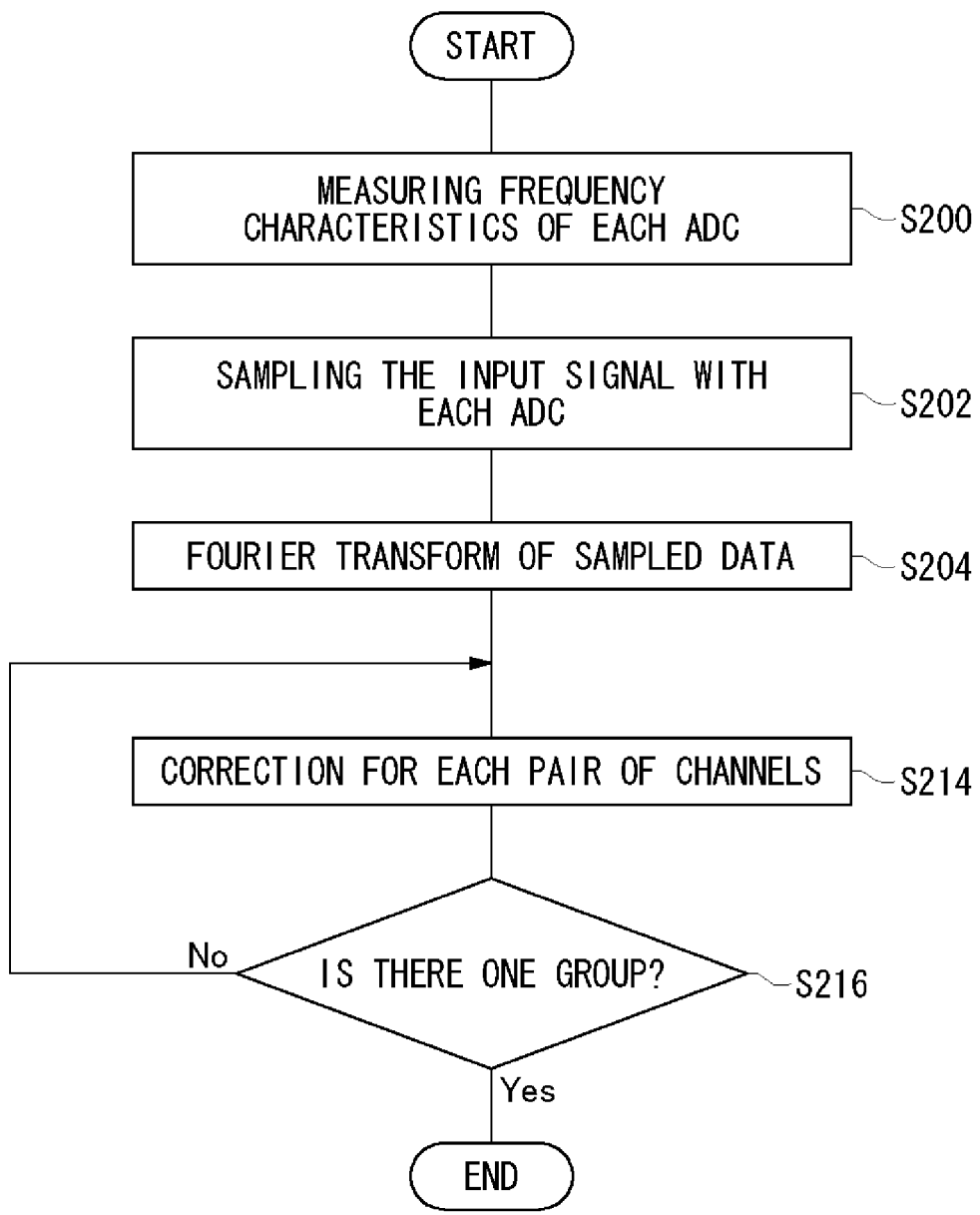
FIG. 12 is a flow chart showing an exemplary operation of the interleaved AD converting apparatus 100 shown in FIG. 11.

FIG. 12 is a flow chart showing an exemplary operation of the interleaved AD converting apparatus 100 shown in FIG. 11. First, the interleaved AD converting apparatus 100 of the present embodiment performs the processes from S200 to S204 described in relation to FIG. 7.

Then, at the initial correction step S214, each intra-group correcting section 20 corrects the corresponding pair of measurement signals based on the frequency characteristics of the corresponding ADCs 10 and combines the corrected measurement signals. At the correction step S214, each intra-group correcting section 20 calculates the first correction coefficient, which is to be multiplied by one of the measurement signals such that the spurious components of each measurement signal caused by the frequency characteristics of the ADCs 10 cancel out, based on the frequency characteristics of the two corresponding ADCs 10. More specifically, each intra-group correcting section 20 may calculate the first correction coefficient $L_1$ based on the expression shown below.

$$L_1 = \frac{1}{a_M(1)} \quad \text{Expression 11}$$

Here, $a_M(1)$ represents the components corresponding to the spurious components among the frequency characteristics of the ADC 10 corresponding to the measurement signal to be multiplied by the first correction coefficient. The frequency characteristics $a_M(k)$ of the ADC 10 corresponding to the measurement signal to be multiplied by the first correction coefficient uses the frequency characteristics $a_R(k)$ of the reference ADC 10, i.e. the frequency characteristics normalized as $a_R(k)=1$, as a reference.

In the example of FIG. 11, the intra-group correcting section 20-0 calculates the first correction coefficient $L_1$ using the frequency characteristic $a_4(1)$ with $a_0(k)=1$. In the same way, the intra-group correcting section 20-2 calculates the first correction coefficient $L_1$ using the frequency characteristic $a_6(1)$ with $a_2(k)=1$. The intra-group correcting section 20-1 calculates the first correction coefficient $L_1$ using the frequency characteristic $a_5(1)$ with $a_1(k)=1$. The intra-group correcting section 20-4 calculates the first correction coefficient $L_1$ using the frequency characteristic $a_7(1)$ with $a_4(k)=1$.

At the correction step S214, each intra-group correcting section 20 calculates a second correction coefficient y for correcting the phase error of the signal components of the measurement signals caused by the multiplication with the first correction coefficient, based on the first correction coefficient $L_1$ and the frequency characteristics of the corresponding ADCs 10. More specifically, each intra-group correcting section 20 may calculate the correction coefficient γ based on the expression shown below.

$$\gamma = \frac{1}{1 + a_M(0) \cdot L_1} \quad \text{Expression 12}$$

Here, $a_M(0)$ represents the components corresponding to the signal components among the frequency characteristics of the ADC 10 corresponding to the measurement signal to be multiplied by the first correction coefficient $L_1$.

In the example of FIG. 11, the intra-group correcting section 20-0 calculates the second correction coefficient y using the frequency characteristic $a_4(0)$ with $a_0(k)=1$. In the same way, the intra-group correcting section 20-2 calculates the second correction coefficient γ using the frequency characteristic $a_6(0)$ with $a_2(k)=1$. The intra-group correcting section 20-1 calculates the second correction coefficient γ using the frequency characteristic $a_5(0)$ with $a_1(k)=1$. The intra-group correcting section 20-4 calculates the second correction coefficient γ using the frequency characteristic $a_7(0)$ with $a_4(k)=1$.

At the correction step S214, each intra-group correcting section 20 corrects the measurement signals in the corresponding group based on the first correction coefficient $L_1$ and the second correction coefficient γ, and combines the corrected measurement signals. More specifically, each intra-group correcting section 20 may correct and combine the signals based on the expression shown below.

$$\bar{X}\left(\frac{k}{NTs}\right) = \gamma\left\{DFT_R(k) + L_1 e^{-j2\pi\frac{k}{N}} \cdot DFT_M(k)\right\} \quad \text{Expression 13}$$

Here, $DFT_R(k)$ represents the measurement signal serving as a reference from among the two measurement signals input to each correcting section. Furthermore, $DFT_M(k)$ represents the measurement signal that is not used as a reference from among the two measurement signals input to each correcting section.

When all of the measurement signals have been combined into a single group as a result of each group of signals being combined at the correction step S214, the processing is finished (S216). If the measurement signals are still divided into a plurality of groups, the correction step S214 is repeated until only one group remains. The correction step S214 may be performed by the inter-group correcting section 30 from the second execution thereof and onward. At this time, each first correcting section 32 is provided with the two signals shown by Expression 13. These signals are corrected and combined using Expressions 11, 12, and 13.

For example, the first correcting section 32-0 may calculate the correction coefficients based on Expressions 11 and 12, with $a_M(k)$ being the frequency characteristic $a_4(k)$ using the frequency characteristic $a_0(k)$ as a reference, and combine the signals based on Expression 13. In the same way, the first correcting section 32-1 may calculate the correction coefficients based on Expressions 11 and 12, with $a_M(k)$ being the frequency characteristic $a_3(k)$ using the frequency characteristic $a_1(k)$ as a reference, and combine the signals based on Expression 13.

The second correcting section 34 receives the signals output by the first correcting sections 32-0 and 32-1. The second correcting section 34 corrects and combines these signals using Expressions 11, 12, and 13. For example, the second correcting section 34 may calculate the correction coefficients based on Expressions 11 and 12, with $a_M(k)$ being the frequency characteristic $a_1(k)$ using the frequency characteristic $a_0(k)$ as a reference, and combine the signals based on Expression 13. In this way, since the correction and combination is performed for channel pairs by the correcting sections at a plurality of stages, the correction and combination can be easily performed for a large number of channels by repeating the same process.

As described in relation to FIGS. 8A to 8C, when the correction and combination process is performed at each correction stage, the number of pieces of sampling data handled at each subsequent correction stage is doubled. For example, when n points of sampling data are handled at the final correction stage, n/2 points of sampling data are handled at the previous correction stage.

Therefore, the correcting section at each correction stage may reproduce a mirror image of the complex conjugate of the signal resulting from the combined frequency domain signals on the frequency axis, over a border that is the Nyquist frequency of each correction stage. For example, at the final correction stage, the complex conjugate of the signal resulting from the combined frequency domain signals may be reproduced as a mirror image over the frequency N×fs/2. At the correction stage before the final correction stage, the complex conjugate of the signal resulting from the combined frequency domain signals may be reproduced as a mirror image over the frequency N×fs/4. Here, N represents the number of ADCs 10 and fs represents the sampling frequency of each ADC 10. Each correcting section may multiply the signal resulting from the generation of the complex conjugate by the second correction coefficient.

In the example described above, each correcting section performs the multiplication with the second correction coefficient, but as another example, the correcting section at the final correction stage may perform the multiplication using a second correction coefficient obtained by combining the second correction coefficients of all of the correction stages. In this case, the second correction coefficient at the final correction stage may be calculated as $1/(1+\Sigma a_k(0) \cdot L_k)$ as shown in Expression 9, where k is the number used to identify each ADC 10.

Figure 13:
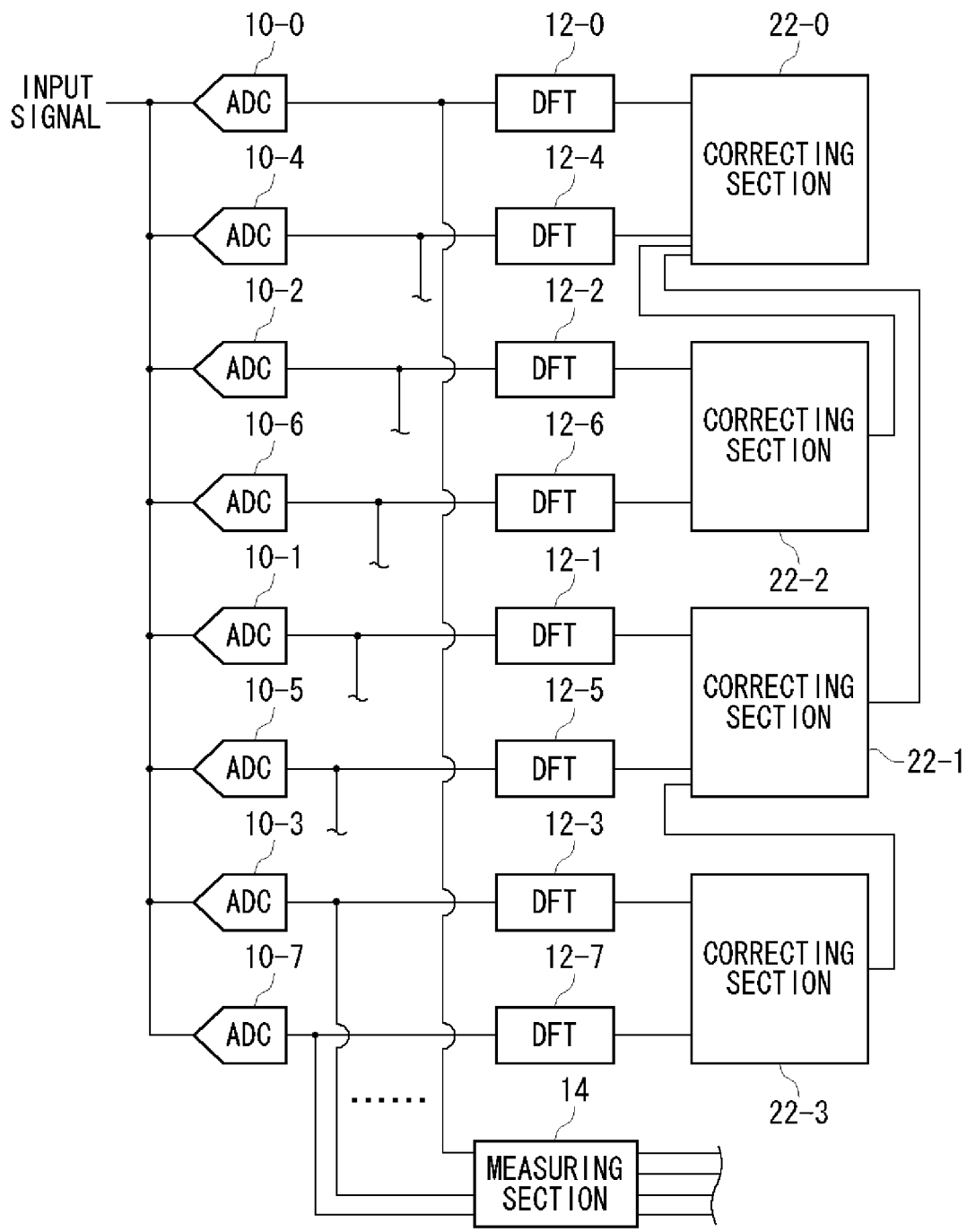
FIG. 13 shows another exemplary configuration of the interleaved AD converting apparatus 100.

FIG. 13 shows another exemplary configuration of the interleaved AD converting apparatus 100. The interleaved AD converting apparatus 100 of the present embodiment includes a plurality of correcting sections 22 instead of the intra-group correcting sections 20 and the inter-group correcting section 30 in the configuration of the interleaved AD converting apparatus 100 shown in FIG. 11. The correcting sections 22 may have the same function as the intra-group correcting section 20 described in relation to FIG. 11. One correcting section 22 may be provided for every two ADCs 10. As described above, from the second execution of the correction step S214 and onward, the correction coefficients are changed and a process identical to the process performed at the initial correction step S214 is performed. Therefore, the interleaved AD converting apparatus 100 of the present embodiment can use the same correcting sections 22 in a plurality of executions of the correction step S214.

At the correction step S214 shown in FIG. 12, each correcting section 22 performs correction and combination for the pair of signals of the corresponding two channels. For example, at the initial correction step S214, the correcting section 22 corrects and combines the measurement signals output by the corresponding Fourier transform sections 12. At this time, the operation of each correcting section 22 may be the same as the operation of the intra-group correcting section 20 described in relation to FIG. 11.

At the second execution of the correction step S214, the composite signals generated by the correcting sections 22 at the initial correction step S214 are input to the correcting sections 22. In the present embodiment, the signals resulting from combination by the correcting section 22-2 and the correcting section 22-3 are input to the correcting section 22-0 and the correcting section 22-1.

The correcting section 22-0 corrects and combines the composite signal generated by the correcting section 22-0 itself at the initial correction step S214 and the composite signal generated by the correcting section 22-2. The correcting section 22-1 corrects and combines the composite signal generated by the correcting section 22-1 itself at the initial correction step S214 and the composite signal generated by the correcting section 22-3.

At the third execution of the correction step S214, the composite signal generated by the correcting section 22-1 at the second execution of the correction step is input to the correcting section 22-0. The correcting section 22-0 corrects and combines the composite signal generated by the correcting section 22-0 itself at the second execution of the correction step S214 and the composite signal generated by the correcting section 22-1. With this configuration, the measurement signals of a large number of channels can be corrected and combined using a simple process and small-scale hardware.

Figure 14:
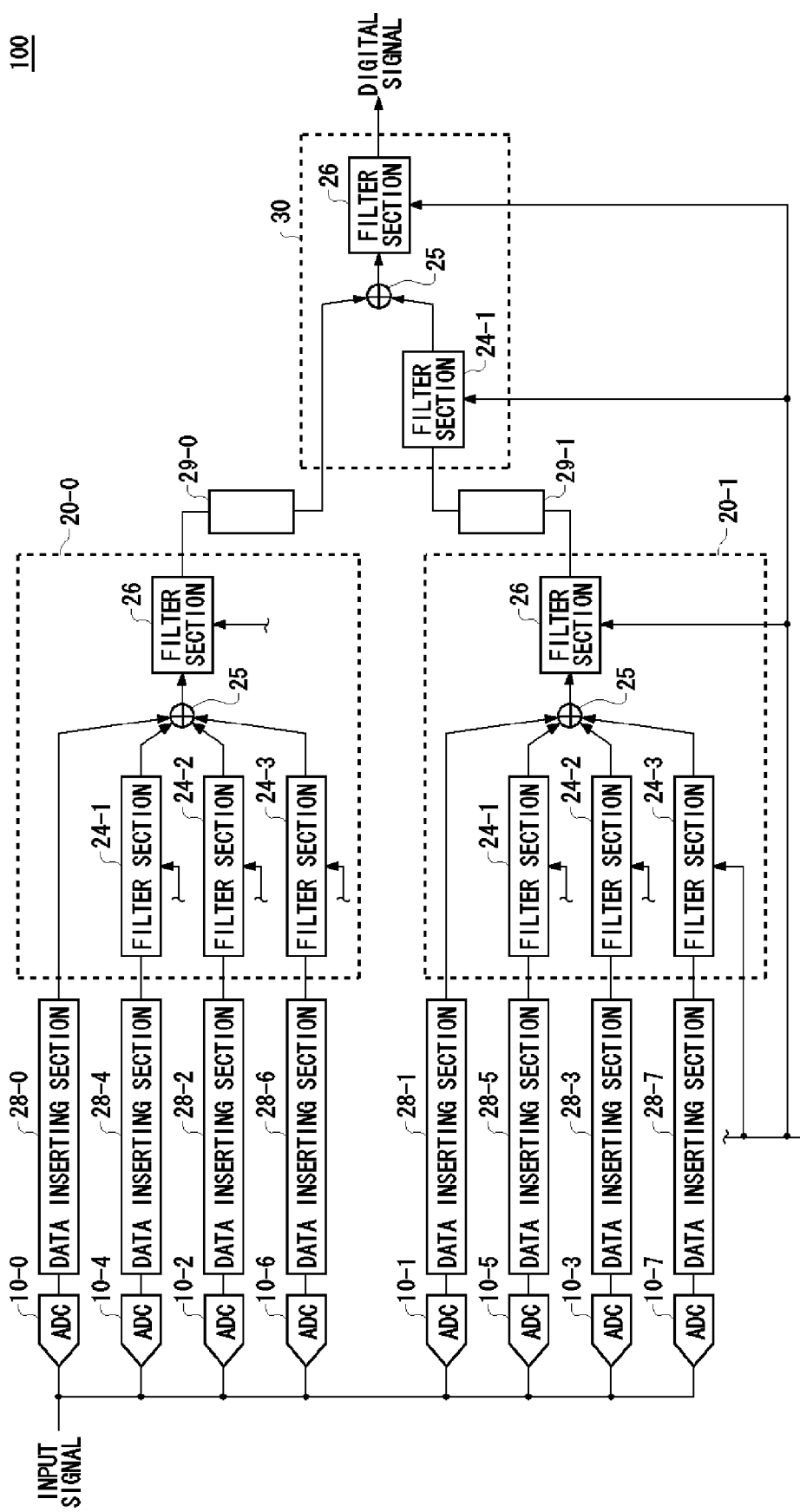
FIG. 14 shows another exemplary configuration of the interleaved AD converting apparatus 100.

FIG. 14 shows another exemplary configuration of the interleaved AD converting apparatus 100. The intra-group correcting sections 20 and the inter-group correcting section 30 of the interleaved AD converting apparatus 100 described in relation to FIGS. 9 to 13 perform corrections in the frequency domain on the measurement signals that are Fourier transformed by the Fourier transform sections 12. In contrast, the intra-group correcting sections 20 and the inter-group correcting section 30 of the interleaved AD converting apparatus 100 of the present embodiment correct each of the measurement signals in the time domain by using digital filters having filter coefficients according to the frequency characteristics of the corresponding ADCs 10.

The interleaved AD converting apparatus 100 of the present embodiment includes a plurality of data inserting sections 28 and a data inserting section 29 instead of the Fourier transform sections 12 in the configuration of the interleaved AD converting apparatus 100 described in relation to FIGS. 9 to 13.

Figure 15:
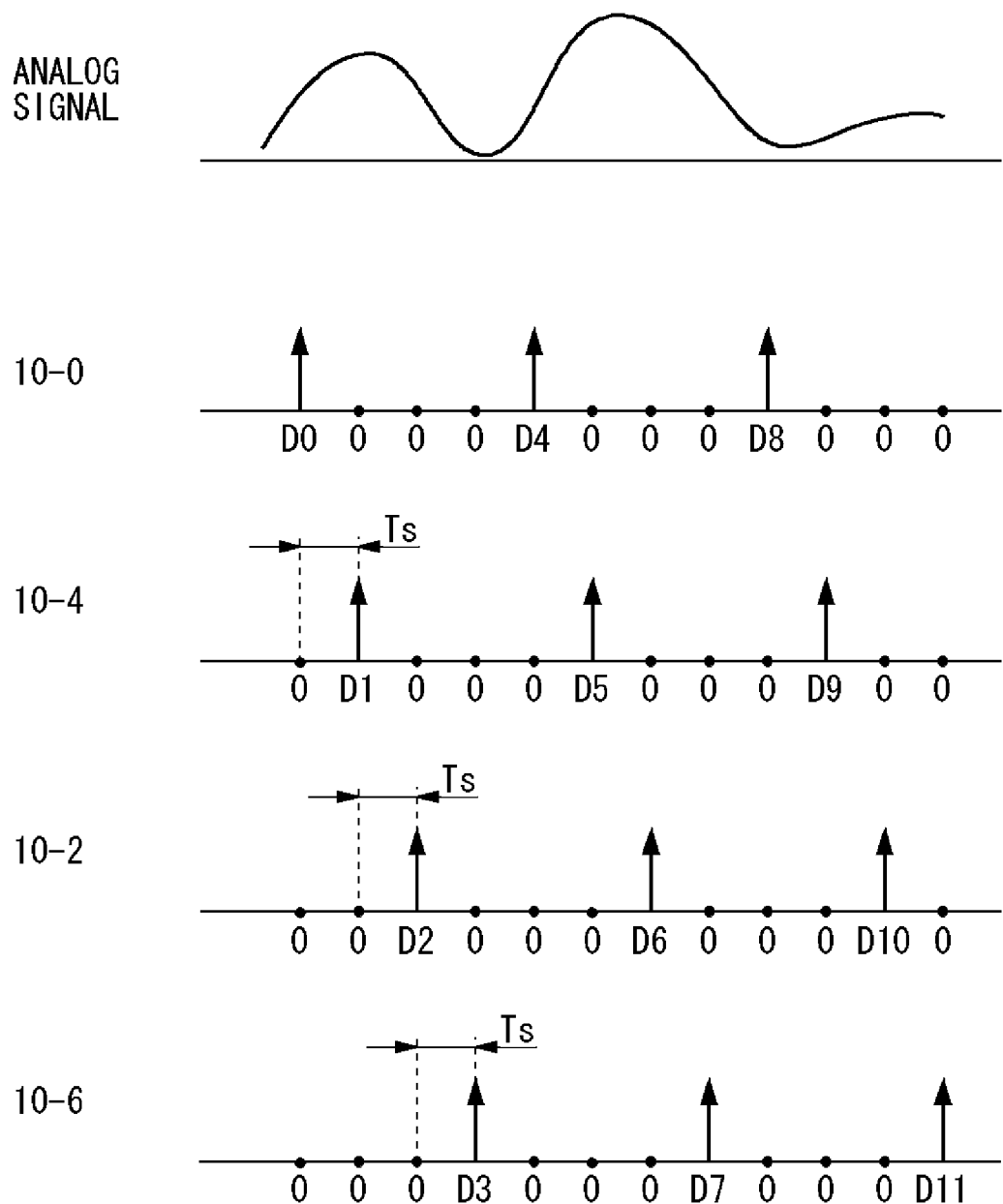
FIG. 15 is a diagram used to describe the operation of the data inserting sections.

The data inserting sections 28 correspond respectively to the ADCs 10, and each data inserting section 28 inserts a predetermined number of pieces of data having values of 0 between each piece of data of the measurement signal output by the corresponding ADC 10. Each data inserting section 29 corresponds to an intra-group correcting section 20 and inserts a predetermined number of pieces of data having values of 0 between each piece of data of the composite signal output by the corresponding intra-group correcting section 20. For example, each data inserting section 28 and data inserting section 29 may insert N−1 pieces of data with a value of 0 between each piece of data of the corresponding measurement signal, as shown in FIG. 15. Each data inserting section 28 preferably inserts data with a value of 0 such that the data intervals of the measurement signal after insertion are substantially uniform.

Here, N represents the number of signals input to the correcting section. In the present embodiment, for the data inserting sections 28, four signals are input to each correcting section at the subsequent stage, and therefore each data inserting section 28 inputs three pieces of 0-value data between each piece of data in the corresponding measurement signal. Furthermore, for the data inserting sections 29, two signals are input to each correcting section at the subsequent stage, and therefore each data inserting section 29 inserts one piece of 0-value data between each piece of data in the corresponding measurement signal.

The intra-group correcting sections 20 and the inter-group correcting section 30 of the present embodiment each include a filter section 24, a combining section 25, and a filter section 26. By setting the filter coefficient in each filter section, the intra-group correcting sections 20 and the inter-group correcting section 30 described above can perform the correction process in the time domain.

A filter section 24 is provided for each measurement signal input to a correcting section. As shown in FIG. 14, a filter section 24 need not be provided for the input serving as the reference. Each filter section 24 is set to have a filter coefficient according to the frequency characteristics of the corresponding ADC 10, and passes the corresponding measurement signal to the combining section 25. More specifically, each filter section 24 includes a filter coefficient obtained by performing an inverse Fourier transform on the corresponding first correction coefficient L.

Each combining section 25 receives the corresponding measurement signals via the filter sections 24 and combines the received measurement signals. Here, the combination is performed by adding together data at the same phase in each measurement signal.

Each filter section 26 is set to have a filter coefficient according to the frequency characteristics of the corresponding ADCs 10, and passes the signal resulting from the combination of the measurement signals combined by the combining section 25. Each filter section 26 may have a filter coefficient obtained by performing an inverse Fourier transform on the second correction coefficient $(1/\Sigma a_k(0) \times L_k)$ described in relation to Expressions 9 and 10. The measuring section 14 may control the filter coefficient of each filter section based on the frequency characteristics of each ADC 10.

In other words, each filter section 24 has a filter coefficient obtained by performing an inverse Fourier transform on the first correction coefficient, e.g. $L_k$, where k is the number used to identify the ADC 10 corresponding to the filter section 24, that cancels out the spurious components caused by the frequency characteristics of the ADCs 10 when converting the measurement signals into frequency domain signals. Furthermore, each filter section 26 has a filter coefficient obtained by performing an inverse Fourier transform on the second coefficient, e.g. $1/\Sigma a_k(0) \times L_k$, where k is the number identifying an ADC 10 in the corresponding group, for correcting the phase error caused by the multiplication by the first correction coefficients. Here, the first correction coefficients may be determined for each divided bandwidth obtained by dividing the frequency band of the digital signal, as shown in Expressions 6 to 8. The second correction coefficients may be determined for each divided bandwidth as shown in Expressions 9 and 10. As a result, a digital signal can be generated that has the spurious components, which are caused by errors in the frequency characteristics of the ADCs 10, eliminated therefrom.

In the example of FIG. 14, a filter section 26 is provided for each correction stage. As another example, a filter section 26 can be provided only at the final correction stage. In this case, the filter section 26 at the final correction stage may have a filter constant obtained by combining the filter constants of the filter sections 26 at each of the correction stages. For example, the filter section 26 at the final correction stage may have a filter constant obtained by performing an inverse Fourier transform on $1/(1+\Sigma a_k(0) \cdot L_k)$, where k is the number identifying an ADC 10 of the interleaved AD converting apparatus 100.

FIG. 15 is a diagram used to describe the operation of the data inserting sections. As described above, each data inserting section 28 inserts a prescribed number of pieces of data with a value of 0 between each piece of data of the measurement signal output by the corresponding ADC 10. For example, the ADC 10-0 outputs a measurement signal including {D0, D4, D8, ... }, and the data inserting section 28-0 may insert three pieces of 0-value data between each piece of data in this measurement signal. As a result, the measurement signal output by the data inserting section 28-0 has a data sequence of {D0, 0, 0, 0, D4, 0, 0, 0, D8, 0, 0, 0, ... }.

The phase of each piece of data in the measurement signal output by each ADC 10 differs from the preceding piece of data by Ts, as shown in FIG. 15. Each data inserting section 28 preferably inserts 0-value data at prescribed intervals of Ts between each piece of data of the corresponding measurement signal.

As described in relation to FIGS. 11 to 13, when the correction process is performed for each set of two channels, each correction process may be performed in the time domain using a digital filter, in the same manner as described in relation to FIGS. 14 and 15. In this case, a data inserting section is provided for each input of each correcting section. Each data inserting section may insert one piece of 0-value data between each piece of data in the input signal input to the corresponding correcting section.

In the example of FIG. 13, each correcting section 22 may include a data inserting section that inserts data into each of the two signals input to the correcting section 22. With this configuration, the correcting sections 22 can be used commonly in each correction stage.

Figure 16:
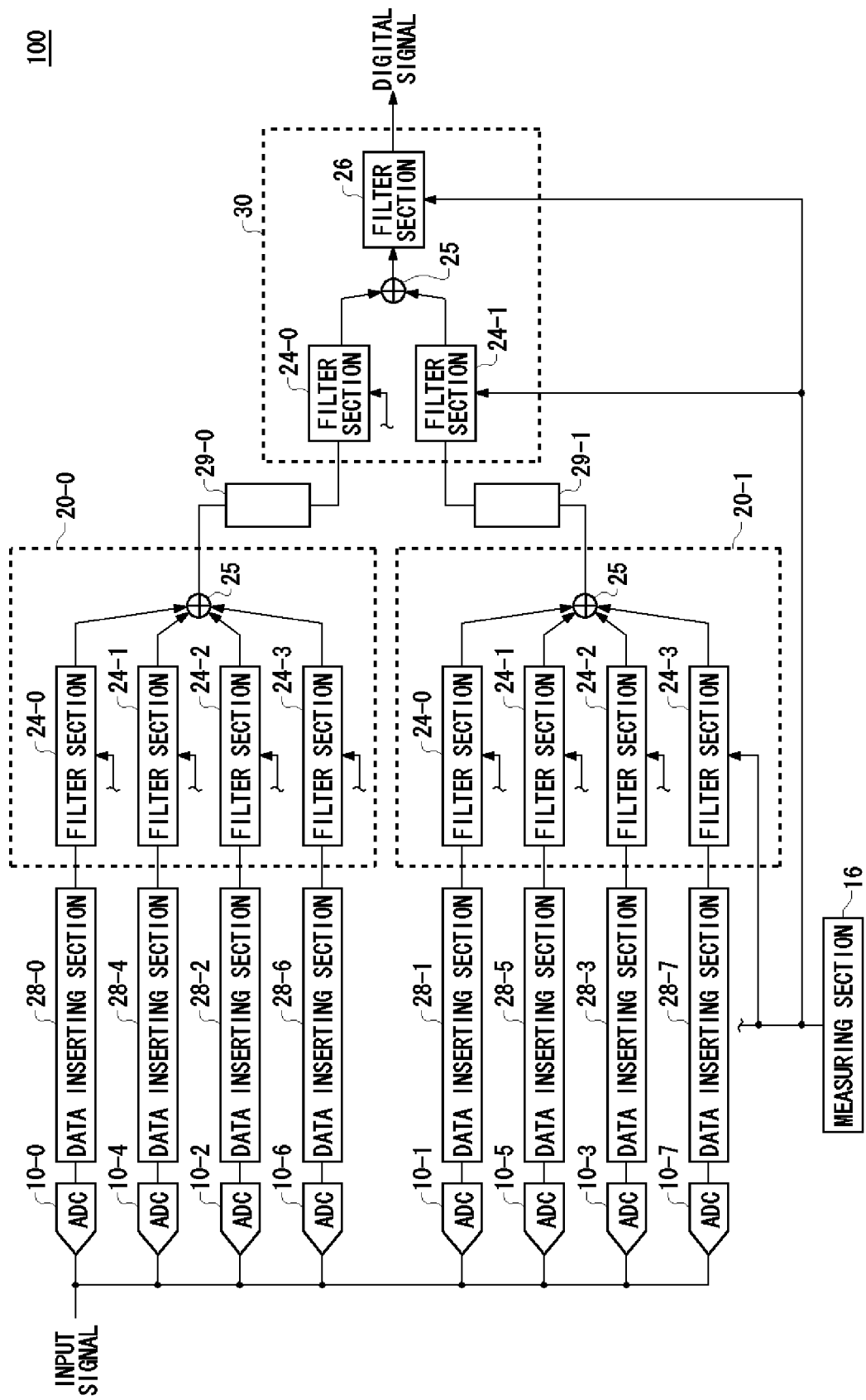
FIG. 16 shows another exemplary configuration of the interleaved AD converting apparatus 100.

FIG. 16 shows another exemplary configuration of the interleaved AD converting apparatus 100. The interleaved AD converting apparatus 100 of the present embodiment further includes a filter section 24-0 in each correcting section, in addition to the configuration of the interleaved AD converting apparatus 100 described in FIG. 13. Furthermore, only the final correction stage includes a filter section 26. As shown in FIG. 16, for example, in a configuration with two correction stages, each intra-group correcting section 20 in the first correction stage includes a filter section 24-0 instead of a filter section 26. Furthermore, the inter-group correcting section 30 in the second correction stage may include the filter section 24-0 in addition to the configuration described in relation to FIG. 13.

Each filter section 24-0 is provided to correspond to the ADC 10 serving as the reference in each correcting section. Each filter section 24-0 corrects the measurement signal serving as a reference, by using the second correction coefficient calculated by the correcting section. The other filter sections 24-1 to 24-3 each correct the corresponding measurement signal by using the first correction coefficients and the second correction coefficient calculated for the corresponding correcting section.

The filter section 26 of the correcting section at the final stage has a filter coefficient obtained by performing an inverse Fourier transform on $1/a_0(0)$, and passes the signal output by the combining section 25. With this configuration as well, the correction process described in relation to Expressions 9 and 10 can be performed.

As made clear from the above, the interleaved AD converting apparatus 100 can perform an interleaved AD conversion to obtain a frequency spectrum in which spurious components are eliminated. Furthermore, by dividing the measurement signals and processing the groups of divided measurement signals, the interleaved AD converting apparatus 100 can obtain the frequency spectrum in which spurious components are eliminated using a simple process.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the aspects of the present embodiment can be used to realize an analog-digital converting method and an analog-digital converting apparatus that can accurately calculate the frequency spectrum of a digital signal.

What is claimed is:

1. An analog-digital converting method for converting an analog signal into a digital signal using a plurality of analog-digital converters provided with a sampling clock whose phase is shifted by a prescribed period for each analog-digital converter, the analog-digital converting method comprising:
   measurement of measuring, in advance, frequency characteristics of each of the analog-digital converters;
   sampling of sampling the analog signal using the analog-digital converters;
   intra-group correction of, for each of a plurality of groups obtained by dividing a plurality of measurement signals generated using the analog-digital converters, generating measurement signals that would be obtained when the frequency characteristics of the corresponding analog-digital converters are ideal by multiplying the measurement signals by a correction coefficient that is based on the frequency characteristics of all the analog-digital converters in the group; and
   inter-group correction of correcting and combining the frequency characteristics of the groups based on a difference in the frequency characteristics between the groups formed during the intra-group correction, to generate a frequency spectrum of the digital signal.

2. The analog-digital converting method according to claim 1, wherein
   the intra-group correction includes, for each of the analog-digital converters in each group, correcting the frequency characteristics of the measurement signals in the group while using the frequency characteristics of one of the analog-digital converters in the group as a reference.

3. The analog-digital converting method according to claim 2, wherein
   the inter-group correction includes using the frequency characteristics of one of the groups as a reference to correct the frequency characteristics of the other group.

4. The analog-digital converting method according to claim 3, wherein
   the intra-group correction includes dividing the measurement signals such that each group includes the same number of measurement signals.

5. The analog-digital converting method according to claim 4, wherein
   the intra-group correction includes dividing the measurement signals such that the number of measurement signals in each group is a power of two.

6. The analog-digital converting method according to claim 3, wherein
   the intra-group correction includes dividing the measurement signals into groups that each contain two measurement signals and correcting the frequency characteristics of each group, and
   the inter-group correction includes:
   pairing of dividing the groups into pairs, correcting the frequency characteristics of each pair based on the frequency characteristic difference between the groups, and generating a new group by combining the two corrected groups; and
   repetition of repeating the pairing until one group remains.

7. The analog-digital converting method according to claim 6, wherein the intra-group correction includes:
   first calculation of, for each group, calculating a first correction coefficient that is multiplied by one of the measurement signals to cancel out a spurious component in each measurement signal caused by the frequency characteristics of each of the analog-digital converters, based on the frequency characteristics of the two analog-digital converters;
   second calculation of, for each group, calculating a second correction coefficient for correcting error of a signal component of the measurement signal caused by the multiplication by the first correction coefficient, based on the first correction coefficient and the frequency characteristics of the analog-digital converters; and
   coefficient multiplication of, for each group, correcting each of the measurement signals based on the first correction coefficient and the second correction coefficient.

8. The analog-digital converting method according to claim 7, wherein
   the first calculation includes calculating the first correction coefficient $L_1$ based on the expression $$L_1 = \frac{1}{a_M(1)},$$

in which $a_M(1)$ represents a component corresponding to the spurious component from among the frequency characteristics of the analog-digital converter corresponding to the measurement signal that is multiplied by the first correction coefficient, and
   the second calculation includes calculating the second correction coefficient $\gamma$ based on the expression $$\gamma = \frac{1}{1 + a_M(0) \cdot L_1},$$

in which $a_M(0)$ represents a component corresponding to the signal component from among the frequency characteristics of the analog-digital converter corresponding to the measurement signal that is multiplied by the first correction coefficient.

9. The analog-digital converting method according to claim 3, further comprising Fourier transformation of performing a Fourier transform on each measurement signal output by an analog-digital converter, wherein
the intra-group correction and the inter-group correction include performing a correction in a frequency domain on the measurement signals on which the Fourier transform was performed during the Fourier transformation.

10. The analog-digital converting method according to claim 3, wherein
the intra-group correction and the inter-group correction include correcting the measurement signals in a time domain by using digital filters each having a filter coefficient corresponding to the frequency characteristics of corresponding analog-digital converters.

11. The analog-digital converting method according to claim 1, wherein
the intra-group correction includes:
first calculation of, for each group, calculating first correction coefficients that are respectively multiplied by the measurement signals to cancel out a spurious component in each measurement signal caused by the frequency characteristics of each of the analog-digital converters, based on the frequency characteristics of all of the analog-digital converters; and
second calculation of, for each group, calculating a second correction coefficient for correcting phase error of signal components of the measurement signals caused by the multiplication by the first correction coefficients, based on the first correction coefficients and the frequency characteristics of the analog-digital converters,
each measurement signal is multiplied by a corresponding first correction coefficient, and
the correction includes combining the measurement signals that have each been multiplied by the corresponding first correction coefficient and multiplying the resulting signal by the second correction coefficient.

12. The analog-digital converting method according to claim 1, wherein
the intra-group correction includes:
first calculation of, for each group, calculating first correction coefficients that are respectively multiplied by the measurement signals to cancel out a spurious component in each measurement signal caused by the frequency characteristics of each of the analog-digital converters, based on the frequency characteristics of all of the analog-digital converters; and
second calculation of, for each group, calculating second correction coefficients for correcting phase error of signal components of the measurement signals caused by the multiplication by the first correction coefficients, based on the first correction coefficients and the frequency characteristics of the analog-digital converters, and
each measurement signal is multiplied by a corresponding first correction coefficient and a corresponding second correction coefficient.

13. The analog-digital converting method according to claim 11, wherein
the intra-group correction includes, for each group, dividing a frequency band of the digital signal to be calculated, according to the number of analog-digital converters,
the first calculation includes calculating the first correction coefficients for each of the divided frequency bands, and
the second calculation includes calculating the second correction coefficient for each of the divided frequency bands.

14. The analog-digital converting method according to claim 13, wherein
the first calculation includes calculating, for each of the divided frequency bands, the first correction coefficients that cancel out the spurious components within the divided frequency band, from among the spurious components of the measurement signal.

15. The analog-digital converting method according to claim 1, wherein
the measurement includes measuring the frequency characteristics that include a phase error in the sampling clock, by using the sampling clock provided when converting the analog signal into the digital signal to measure the frequency characteristics.

16. The analog-digital converting method according to claim 11, wherein
the intra-group correction includes generating each group to include N measurement signals, where N is an integer greater than one,
the measurement signals $X_0(f)$ to $X_{N-1}(f)$ in each group are calculated as shown in the expressions $$X_0(f) = \bar{x}(-l) + \bar{x}(-l+1) + \ldots + \bar{x}(m-1) + \bar{x}(m)$$
$$X_1(f) = a_1(-l)\bar{x}(-l) + a_1(-l+1)\bar{x}(-l+1) + \ldots + a_1(m-1)\bar{x}(m)$$
$$\vdots$$
$$X_{N-1}(f) = a_{N-1}(-l)\bar{x}(-l) + a_{N-1}(-l+1)\bar{x}(-l+1) + \ldots + a_{N-1}(m-1)\bar{x}(m),$$

in which fs represents sampling frequency of each analog-digital converter, the terms from −l to m represent components within a bandwidth of [0, Nfs] when X(f) has a bandwidth of [−Nfs/2, Nfs/2], and $a_j(k)$ represents components corresponding to $\bar{x}(k)$ among the frequency characteristics of the j-th analog-digital converter, and
the first calculation includes calculating first correction coefficients $L_1, L_2, \ldots, L_{N-1}$ that satisfy the expression $$X_0(f) + L_1 X_1(f) + L_2 X_2(f) + \ldots + L_{N-1} X_{N-1}(f) = \alpha \bar{x}(0) + \beta \bar{x}(u),$$

in which $\alpha$ and $\beta$ are arbitrary real numbers and $x(u)$ is an aliasing component of $x(0)$.

17. The analog-digital converting method according to claim 16, wherein
the second calculation includes calculating the second correction coefficient using the expression $$\frac{1}{1 + a_1(0)L_1 + a_2(0)L_2 + \ldots + a_{N-1}(0)L_{N-1}},$$

the intra-group correction includes calculating a composite signal X'(f) obtained by combining the measurement signals in each group based on the expression $$X'(f) = \frac{1}{1 + a_1(0)L_1 + a_2(0)L_2 + \ldots + a_{N-1}(0)L_{N-1}} \{X_0(f) + L_1 X_1(f) + L_2 X_2(f) + \ldots + L_{N-1} X_{N-1}(f)\}.$$

18. The analog-digital converting method according to claim 11, wherein
the intra-group correction includes generating each group to include N measurement signals, where N is an integer greater than one,
the measurement signals $X_0(f)$ to $X_3(f)$ in each group are calculated as shown in the expressions $X_0(f) = \bar{x}(-1) + \bar{x}(0) + \bar{x}(1) + \bar{x}(2) + \bar{x}(3) + \bar{x}(4) + \bar{x}(5)$ $X_1(f) = a_1(-1)\bar{x}(-1) + a_1(0)\bar{x}(0) + a_1(1)\bar{x}(1) + a_1(2)\bar{x}(2) + a_1(3)\bar{x}(3) + a_1(4)\bar{x}(4) + a_1(5)\bar{x}(5)$ $X_2(f) = a_2(-1)\bar{x}(-1) + a_2(0)\bar{x}(0) + a_2(1)\bar{x}(1) + a_2(2)\bar{x}(2) + a_2(3)\bar{x}(3) + a_2(4)\bar{x}(4) + a_2(5)\bar{x}(5)$ $X_3(f) = a_3(-1)\bar{x}(-1) + a_3(0)\bar{x}(0) + a_3(1)\bar{x}(1) + a_3(2)\bar{x}(2) + a_3(3)\bar{x}(3) + a_3(4)\bar{x}(4) + a_3(5)\bar{x}(5)$, in which fs represents sampling frequency of each analog-digital converter, the terms from k=−1 to k=5 represent components within a bandwidth of [0, 4fs] when X(f) has a bandwidth of [−2 fs, 2 fs], and $a_j(k)$ represents components corresponding to $\bar{x}(k)$ among the frequency characteristics of the j-th analog-digital converter, and
the first calculation includes calculating first correction coefficients $L_1$, $L_2$, and $L_3$ that satisfy the expression $X_0(f) + L_1 X_1(f) + L_2 X_2(f) + L_3 X_3(f) = \alpha \bar{x}(0) + \beta \bar{x}(4)$, in which α and β are arbitrary real numbers.

19. The analog-digital converting method according to claim 18, wherein
the second calculation includes calculating the second correction coefficient as shown in the expression $$\frac{1}{1 + a_1(0)L_1 + a_2(0)L_2 + a_3(0)L_3},$$

and
the intra-group correction includes calculating a composite signal X'(f) obtained by combining the measurement signals in each group based on the expression $X'(f) =$ $$\frac{1}{1 + a_1(0)L_1 + a_2(0)L_2 + a_3(0)L_3} \{X_0(f) + L_1 X_1(f) + L_2 X_2(f) + L_3 X_3(f)\}.$$

20. The analog-digital converting method according to claim 19, wherein
the correction includes dividing the frequency band of the digital signal to be calculated into a first region with a bandwidth [0, fs], a second region with a bandwidth [fs, 2 fs], a third region with a bandwidth [2 fs, 3 fs], and a fourth region with a bandwidth [3 fs, 4 fs], and the first calculation includes:
calculating the first correction coefficients in the first region based on the expression $$\begin{pmatrix} L_1 \\ L_2 \\ L_3 \end{pmatrix} = \begin{pmatrix} a_1(1) & a_2(1) & a_3(1) \\ a_1(2) & a_2(2) & a_3(2) \\ a_1(3) & a_2(3) & a_3(3) \end{pmatrix}^{-1} \begin{pmatrix} -1 \\ -1 \\ -1 \end{pmatrix};$$

calculating the first correction coefficients in the second and third regions based on the expression $$\begin{pmatrix} L_1 \\ L_2 \\ L_3 \end{pmatrix} = \begin{pmatrix} a_1(-1) & a_2(-1) & a_3(-1) \\ a_1(1) & a_2(1) & a_3(1) \\ a_1(2) & a_2(2) & a_3(2) \end{pmatrix}^{-1} \begin{pmatrix} -1 \\ -1 \\ -1 \end{pmatrix};$$

and
calculating the first correction coefficients in the fourth region based on the expression $$\begin{pmatrix} L_1 \\ L_2 \\ L_3 \end{pmatrix} = \begin{pmatrix} a_1(2) & a_2(2) & a_3(2) \\ a_1(3) & a_2(3) & a_3(3) \\ a_1(5) & a_2(5) & a_3(5) \end{pmatrix}^{-1} \begin{pmatrix} -1 \\ -1 \\ -1 \end{pmatrix}.$$

21. The analog-digital converting method according to claim 20, wherein the intra-group correction includes:
calculating a frequency spectrum X'(f) of the composite signal in the first and second regions based on the expression $X'(f) =$ $$\frac{1}{1 + a_1(0)L_1 + a_2(0)L_2 + a_3(0)L_3} \{X_0(f) + L_1 X_1(f) + L_2 X_2(f) + L_3 X_3(f)\},$$

and
calculating a frequency spectrum X'(f) of the composite signal in the third and fourth regions based on the expression $X'(f) =$ $$\frac{1}{1 + a_1(4)L_1 + a_2(4)L_2 + a_3(4)L_3} \{X_0(f) + L_1 X_1(f) + L_2 X_2(f) + L_3 X_3(f)\}.$$

22. An analog-digital converting apparatus that converts an analog signal into a digital signal, comprising:
a plurality of analog-digital converters provided with a sampling clock whose phase is shifted by a prescribed period for each analog-digital converter;
a measuring section that measures, in advance, frequency characteristics of each of the analog-digital converters;
Fourier transform sections that perform a Fourier transform on each piece of data obtained by the analog-digital converters sampling the analog signal;
an intra-group correcting section that, for each of a plurality of groups obtained by dividing a plurality of measurement signals, generates ideal measurement signals that would be obtained when the frequency characteristics of the corresponding analog-digital converters are ideal by multiplying the measurement signals by a correction coefficient that is based on the frequency characteristics of all the analog-digital converters in the group;

an inter-group correcting section that corrects the frequency characteristics of the groups based on a difference in the frequency characteristics between the groups formed by the intra-group correcting section; and an interleaving section that combines the ideal measurement signals to generate a frequency spectrum of the digital signal.

* * * * *